(12) United States Patent
Tsai et al.

(10) Patent No.: US 12,362,245 B2
(45) Date of Patent: Jul. 15, 2025

(54) PACKAGE ASSEMBLY INCLUDING A PACKAGE LID HAVING AN INNER FOOT AND METHODS OF MAKING THE SAME

(71) Applicant: Taiwan Semiconductor Manufacturing Company Limited, Hsinchu (TW)

(72) Inventors: Tsung-Fu Tsai, Changhua (TW); Pu Wang, Hsinchu (TW); Ying-Ching Shih, Hsinchu (TW); Szu-Wei Lu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 654 days.

(21) Appl. No.: 17/678,075

(22) Filed: Feb. 23, 2022

(65) Prior Publication Data

US 2023/0018359 A1 Jan. 19, 2023

Related U.S. Application Data

(60) Provisional application No. 63/222,149, filed on Jul. 15, 2021.

(51) Int. Cl.
*H01L 23/10* (2006.01)
*H01L 23/00* (2006.01)
*H01L 23/498* (2006.01)

(52) U.S. Cl.
CPC ........ *H01L 23/10* (2013.01); *H01L 23/49816* (2013.01); *H01L 24/16* (2013.01); *H01L 24/32* (2013.01); *H01L 2224/73204* (2013.01); *H01L 2224/73253* (2013.01); *H01L 2924/15311* (2013.01); *H01L 2924/16153* (2013.01)

(58) Field of Classification Search
CPC .... H01L 23/10; H01L 23/49816; H01L 24/16
See application file for complete search history.

(56) References Cited

U.S. PATENT DOCUMENTS

| | | | |
|---|---|---|---|
| 11,152,282 B1 * | 10/2021 | Arvin | H01L 21/4814 |
| 2013/0270691 A1 * | 10/2013 | Mallik | H01L 23/49833 |
| | | | 257/713 |
| 2021/0183844 A1 * | 6/2021 | Cheng | H01L 24/19 |

\* cited by examiner

*Primary Examiner* — Errol V Fernandes
(74) *Attorney, Agent, or Firm* — The Marbury Law Group, PLLC

(57) ABSTRACT

A package assembly may include a package substrate, a package lid attached to the package substrate and including a plate portion, an outer foot extending from the plate portion, and an inner foot extending from the plate portion inside the outer foot, and an adhesive that adheres the outer foot to the package substrate and the inner foot to the package substrate.

20 Claims, 25 Drawing Sheets

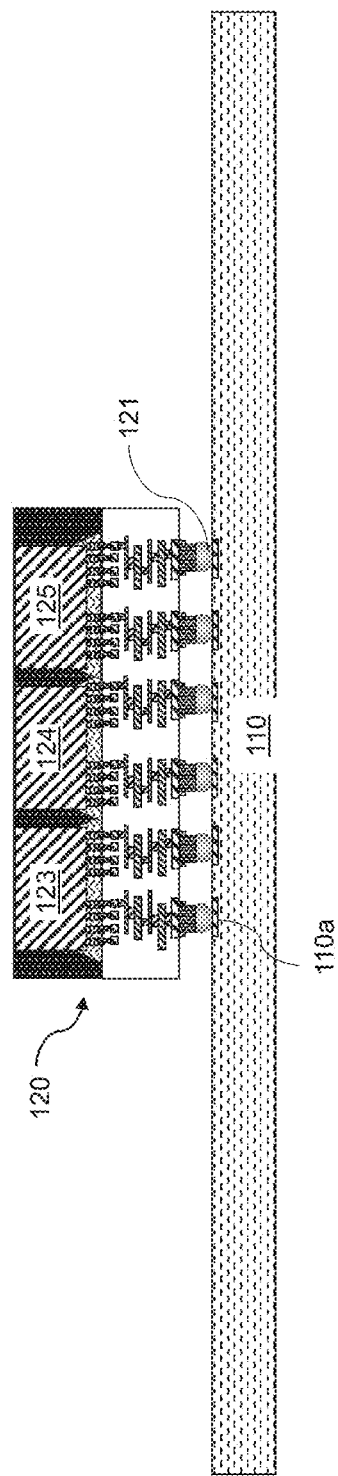

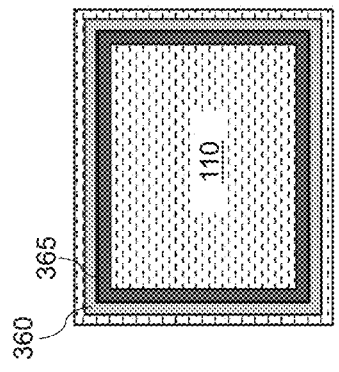
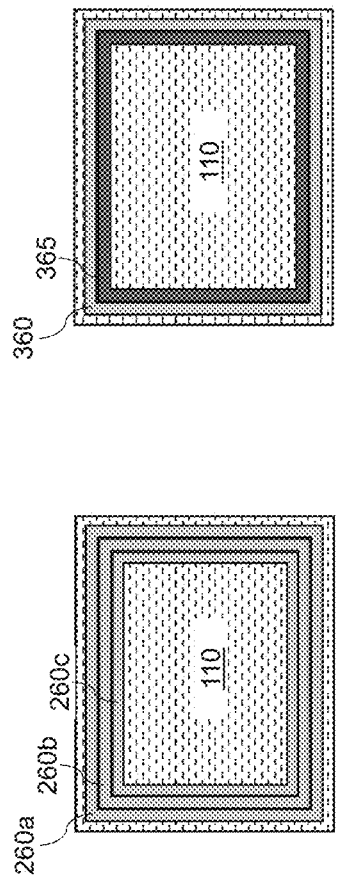
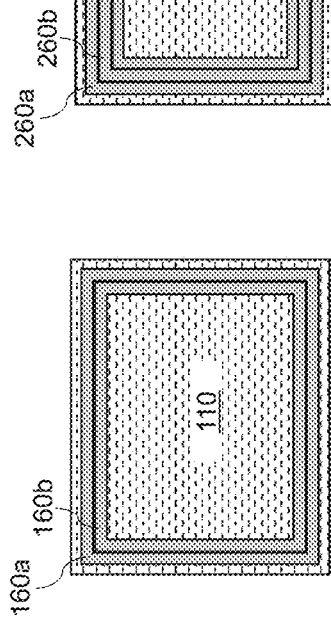
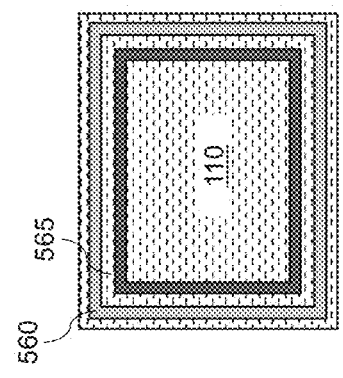
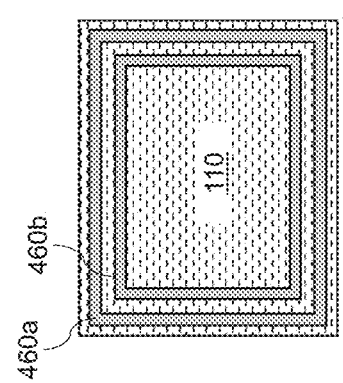

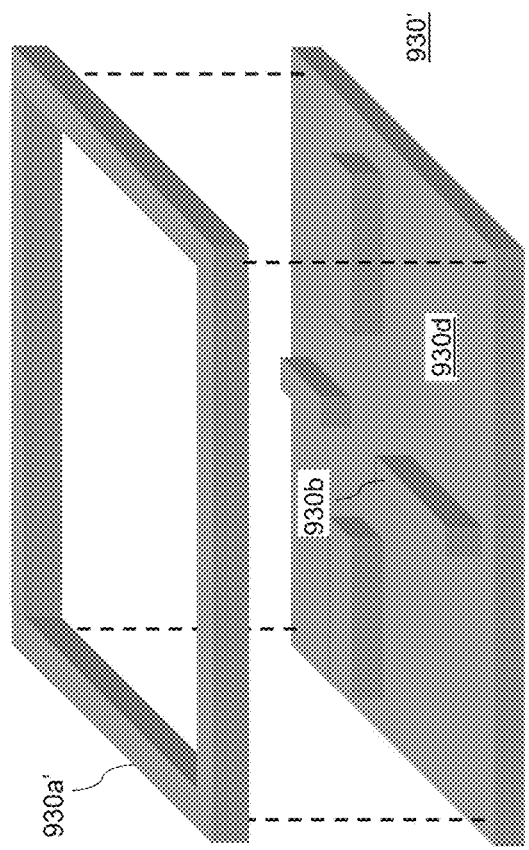
FIG. 9C
FIG. 9D
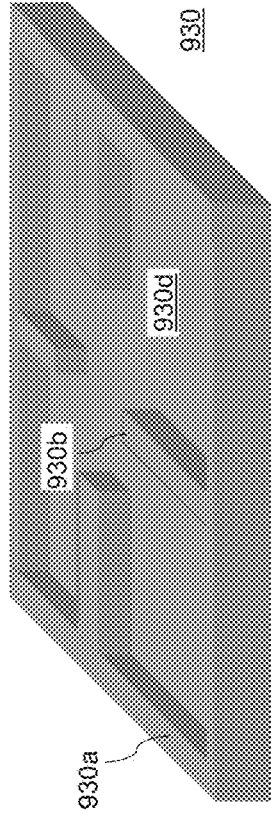
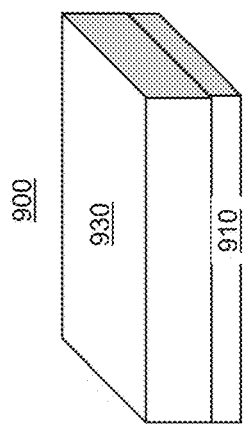
FIG. 9A
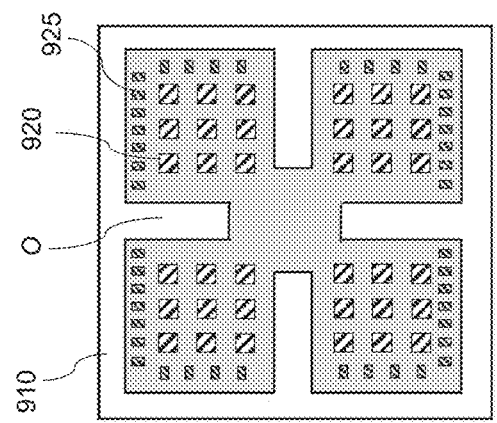
FIG. 9B

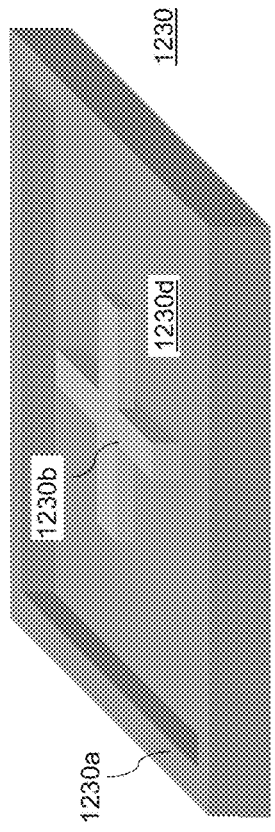
FIG. 12C
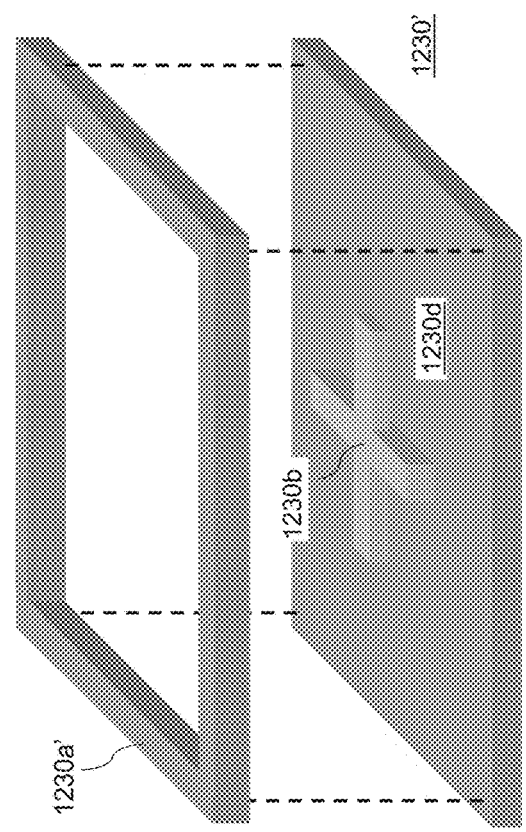
FIG. 12D
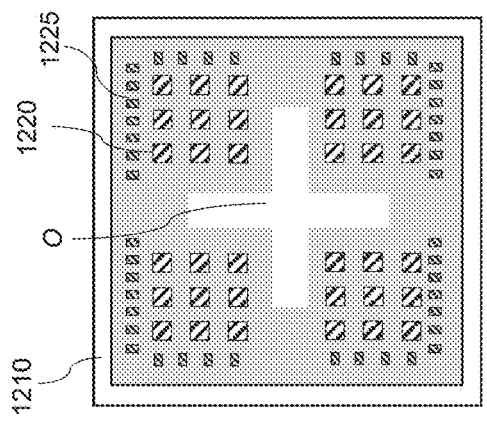
FIG. 12A
FIG. 12B

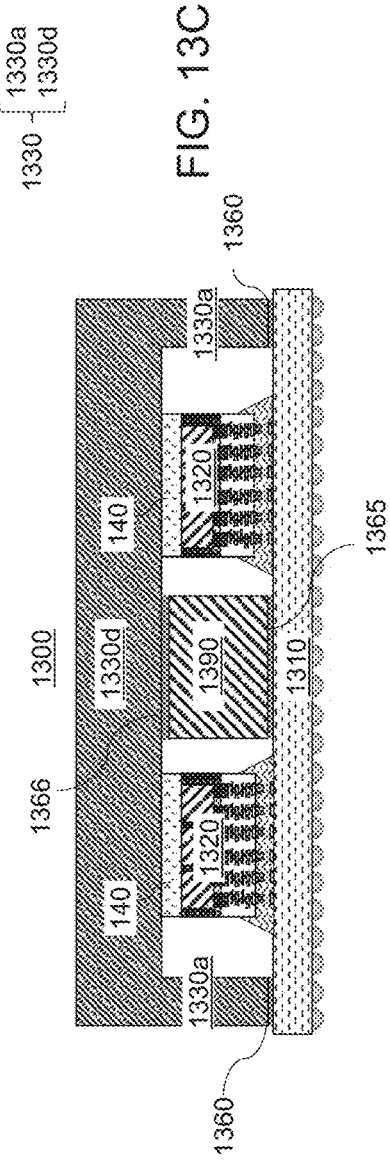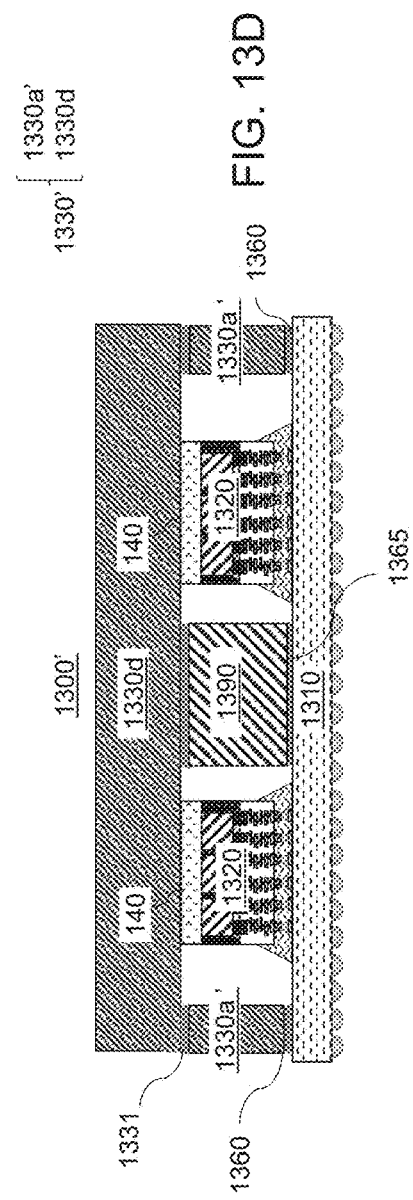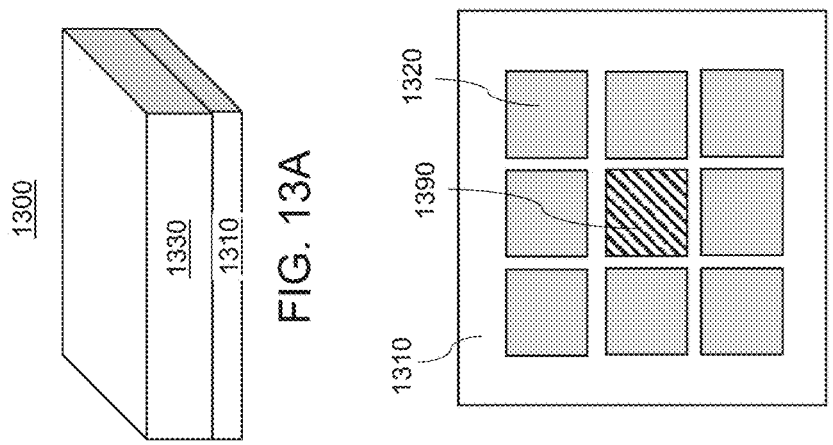

FIG. 14A
FIG. 14B
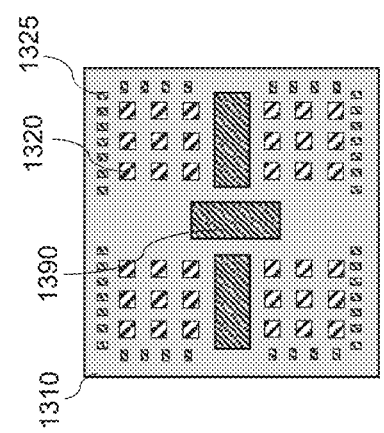
FIG. 14C
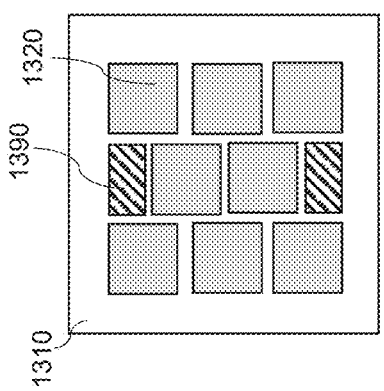
FIG. 14D

| Sample (Pt ratio) | Pt conc.(ppm) |
|---|---|
| A (Pt 50%) | 1.37 |
| D (Pt 100%) | 2.35 |
| F (Pt 150%) | 3.58 |
| B (Pt 80%) | 1.85 |

FIG. 15B

PACKAGE ASSEMBLY INCLUDING A PACKAGE LID HAVING AN INNER FOOT AND METHODS OF MAKING THE SAME

RELATED APPLICATIONS

This application claims the benefit of priority from U.S. Provisional Application No. 63/222,149, entitled "Novel Lid Structure for COP Reduction & RA Performance Improvement" filed on Jul. 15, 2021, the entire contents of which are incorporated herein by reference for all purposes.

BACKGROUND

A package assembly may include one or more semiconductor devices (e.g., semiconductor dies, interposer modules, etc.) that may be mounted on a substrate. The package assembly may also include a package lid mounted on the substrate over the semiconductor devices. The package lid may be attached to the substrate by using an adhesive. Designing the package assembly to avoid delamination of the adhesive and "squeezing out" of the adhesive may be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A illustrates a vertical cross-sectional view of an intermediate structure in which the interposer module 120 may be mounted on the package substrate (e.g., via a flip chip bonding (FCB) process) according to one or more embodiments.

FIGS. 6E-6K illustrate a plan view of an intermediate structure in which an adhesive for attaching a package lid has been dispensed onto the package substrate for a package assembly according to one or more embodiments.

FIG. 9A is a perspective view of a package assembly according to one or more embodiments.

FIG. 9B illustrates an arrangement of a plurality of semiconductor devices on the substrate for the package assembly according to one or more embodiments.

FIG. 9C is a perspective view of the package lid according to one or more embodiments.

FIG. 9D is an exploded perspective view of the package lid that may be substituted for the package lid in the package assembly according to one or more embodiments.

FIG. 12A is a perspective view of a package assembly according to one or more embodiments.

FIG. 12B illustrates an arrangement of a plurality of semiconductor devices on the substrate for the package assembly according to one or more embodiments.

FIG. 12C is a perspective view of the package lid according to one or more embodiments.

FIG. 12D is an exploded perspective view of the package lid that may be substituted for the package lid in the package assembly according to one or more embodiments.

FIG. 13A is a perspective view of a package assembly according to one or more embodiments.

FIG. 13B illustrates an arrangement of a plurality of semiconductor devices on the substrate for the package assembly according to one or more embodiments.

FIG. 13C is a vertical cross-sectional view of the package assembly according to one or more embodiments.

FIG. 13D is a vertical cross-sectional view of a package assembly according to one or more embodiments.

FIG. 14A illustrates an alternative arrangement that includes nine semiconductor devices and two dummy dies between the semiconductor devices according to one or more embodiments.

FIG. 14B illustrates an alternative arrangement that includes four semiconductor devices and three dummy dies between the semiconductor devices according to one or more embodiments.

FIG. 14C illustrates an alternative arrangement that includes thirty-six semiconductor devices and three dummy dies between the semiconductor devices according to one or more embodiments.

FIG. 14D illustrates an alternative arrangement that includes semiconductor devices 1320 and two dummy dies 1390 between the semiconductor devices 1320 on the substrate 1310 for the package assembly 1300 according to one or more embodiments.

FIG. 15B is a chart illustrating a detected platinum concentration (Pt conc.) in parts per million (ppm) for the Samples A, D, F and B, according to one or more embodiments.

DETAILED DESCRIPTION

Figure 1A:
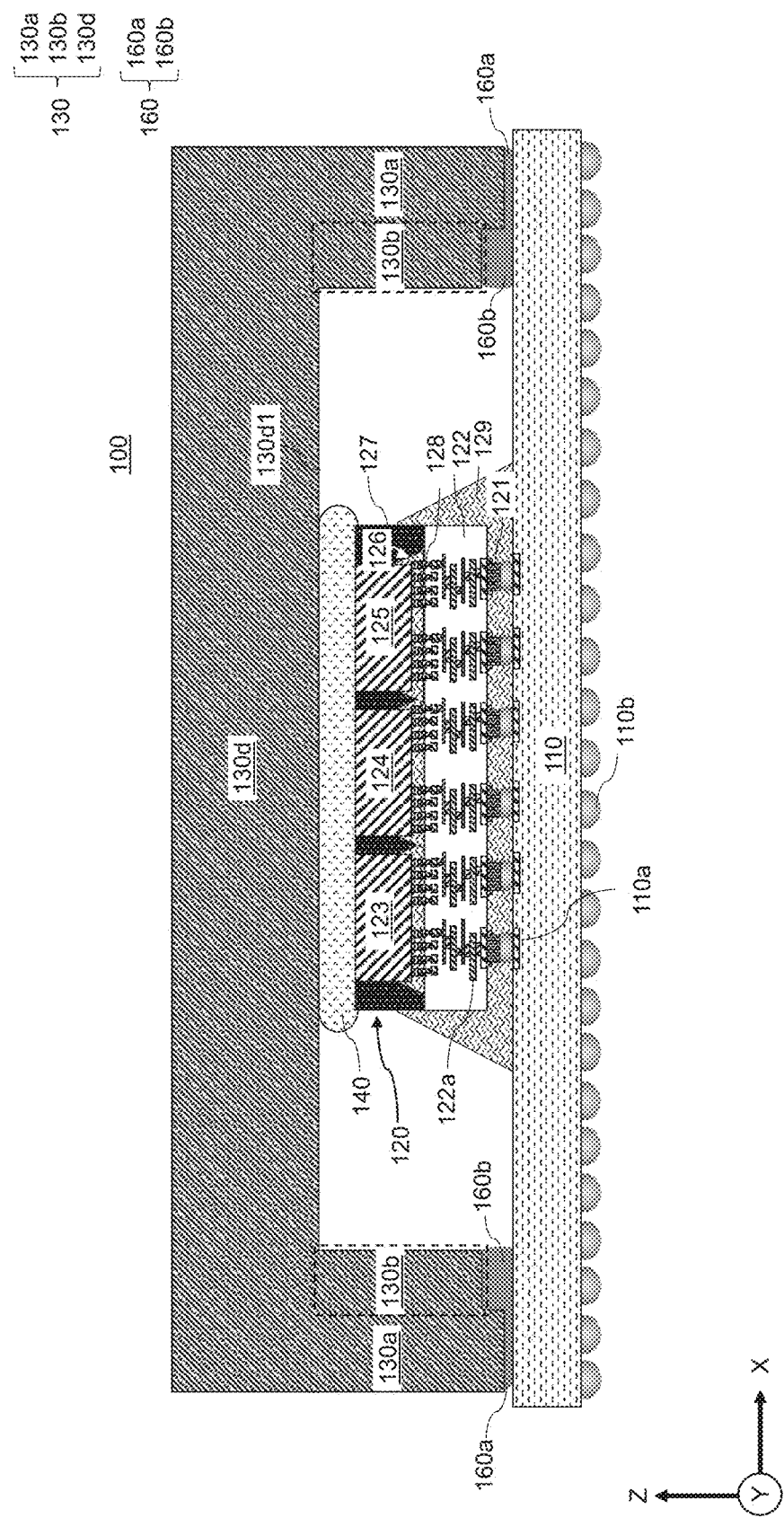
FIG. 1A is a vertical cross-sectional view of a package assembly (e.g., organic/silicon interposer package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

An embodiment of the present invention may provide a novel package assembly (e.g., integrated circuit packaging) and in particular, a novel lid structure that may reduce a coefficient of performance (COP) for the package assembly and improve an reliability performance (e.g., RA performance) of the package assembly. One or more embodiments may be particularly applicable to 2.5D & 3D package assemblies.

A typical package assembly including a chip on wafer on substrate (CoWoS®) device with a package lid may suffer from 1) an unstable and non-uniform thermal interface material (TIM) bond line thickness (BLT), 2) TIM and adhesive delamination post-photographic analysis (e.g., multi-reflow test for ten times (MR10X)), and 3) adhesive squeezing out. A thick lid could reduce package COP, but the RA (e.g., reliability assessment) performance might be influenced. Customers typically require 1) a thinner TIM BLT for lower thermal resistance, 2) no obvious thermal resistance increasing post RA (e.g., after reliability assessment) or MR10X, and 2) no adhesive squeezing out & bleeding onto surrounding structures (e.g., passive components (PC)).

A typical method of making the package assembly and in particular, attaching the package lid to the package substrate, may include 1) dispensing an adhesive on the package substrate and dispensing a TIM on the semiconductor die (e.g., on an interposer module including the semiconductor die), 2) attaching the package lid using a low force, 3) hot press curing the adhesive (e.g., there may be less substrate warpage for a curing temperature in a range from 100° C.-180° C., and 4) mounting solder balls (e.g., a ball grid array (BGA)) on the package substrate.

In attaching the package lid to the package substrate, applying a low force may cause a substrate "cry" warpage at a curing temperature, resulting in 1) a poor TIM merge that may cause a TIM void, and 2) a thicker TIM that may cause a higher thermal resistance. However, applying a high force may cause a substrate "smile" warpage at a curing temp, resulting in an adhesive that may tend to bleed toward passive components (PC) adjacent to the package assembly.

Some factors that may be considered in improving package lid attachment quality may include clamp cure temperature and force, and a curing degree of adhesive before the clamp cure. For less adhesive volume, a low clamp force and high adhesive aspect ratio (A/R), there may be a higher risk of adhesive corner delamination caused by shear stress between the package lid and package substrate. For high adhesive value, a high clamp force and low adhesive A/R (e.g., some of the adhesive is squeezed out), there may be a higher risk of TIM/lid delamination caused by a peeling stress between the package lid and the TIM.

One or more embodiments of the present invention may provide a package lid having a multiple-foot design or a stepped (e.g., multi-stepped) foot design. The package lid may provide 1) a reduction of COP, and/or 2) a reduction in the risk of TIM/lid & adhesive/substrate delamination. In one or more embodiments, the adhesive may be thicker at an inner edge of the foot than at an outer edge of the foot, and this thicker adhesive may act as a stress buffer.

The package lid may include a plurality of inner feet or an inner foot having one or more steps. There may also be a plurality of adhesives used. There may be a first adhesive on a first step and a second adhesive on a second step. In one or more embodiments, the package lid may include plural steps on the same foot, or a plurality of feet (e.g., an outer foot and one or more inner feet) having different lengths. There may be a first adhesive on an outer foot and a second adhesive on an inner foot. An elasticity modulus (e.g., Young's modulus; modulus of elasticity) of the second adhesive may be lower than an elasticity modulus of the first adhesive. That is, an elongation of the first adhesive may be less than an elongation of the second adhesive. For example, an elongation of the first adhesive may be less than 10% and an elongation of the second adhesive may be greater than 10%.

A length (e.g., height) of the inner foot may be less than a length of the outer foot, and the difference in length (e.g., difference in height) may be between 50 and 300 microns. The inner foot width may be greater than or equal to the outer foot width. In particular, the outer foot width may be in a range from 0.5 mm to 6 mm, and the inner foot width may be in a range from 1 mm to 10 mm.

Advantages of the embodiments of the present invention may include a 1) providing a thicker adhesive and lower elasticity modulus adhesive at an inner edge/foot could act as stress buffer and reduce the risk of TIM/lid or adhesive/substrate delamination, 2) there may be no requirement of new tool purchasing, 3) a reduction of package COP, 3) there may be almost no cost added, and 4) there may be better RA performance (e.g., low risk of LID/TIM delamination).

One or more embodiments of the present invention may provide a novel package lid design for chiplet integration. The novel design may reduce a coefficient of performance (COP) for the package assembly and improve an RA performance of the package assembly.

Typically, a CoWoS device may utilize only a ring, a two-piece lid, or a one-piece lid, a multi-chip module (MCM) device may utilize a one-piece lid, and an integrated fan-out (InFO) large scale integrated (LSI) device may utilize a ring with a rib. In an MCM device, the semiconductor chips or chiplets that are bonded onto a substrate such as a printed circuit board (PCB) need to minimize COP. There may be several ways to arrange the chiplets on the substrate in the MCM device.

One or more embodiments of the present invention may reduce a package COP and increase RA performance by using a novel lid design. The novel lid design may include an interior inner foot that may be located between a plurality of semiconductor devices and may have a straight-type design, cross/rib-type design, and/or an island-type design. The novel lid may be formed as a one-piece lid in which case a length of the interior inner foot maybe greater than or equal to a length of the outer foot, or a two-piece lid in which case a length of the interior inner foot may be greater than or equal to a length of the ring.

One or more embodiments may utilize dummy dies (e.g., silicon dies) in certain locations instead of (or in addition to) the inner foot. These embodiments may also include a one-piece lid or two-piece lid.

Advantages of the embodiments of the present disclosure e.g., the novel package lid design for chiplet integration) may include 1) no requirement of new tool purchasing, 2) a reduction of package COP, 3) almost no cost added, and 4) better RA performance.

FIG. 1A is a vertical cross-sectional view of a package assembly 100 (e.g., organic/silicon interposer package) according to one or more embodiments. The package assembly 100 may include a package substrate 110, an interposer module 120 mounted on the package substrate 110, and a package lid 130 on the interposer module 120 and attached to the package substrate 110. The package assembly 100 may also include a TIM film 140 formed on the interposer module 120. The TIM film 140 may include, for example, a thermal paste, thermal adhesive, thermal gap filler, thermal pad (e.g., silicone), thermal tape, a graphite TIM film, and a carbon nanotube TIM film. Other types of TIM films are within the contemplated scope of this disclosure.

The package substrate 110 may include any substrate that can support a package assembly including, for example, a system on integrated substrate (SoIS), a printed circuit board (PCB) etc. In one or more embodiments, the package substrate 110 may include a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. The package substrate 110 may also include metal interconnects and through vias to provide an electrical connection of the package substrate 110.

The package substrate 110 may also include metal bonding pads 110a formed on a chip-side of the package substrate 110, for providing an electrical connection to a semiconductor device (e.g., interposer module, semiconductor die, etc.) that is mounted on the package substrate 110. A ball-grid array (BGA) including a plurality of solder balls 110b may be formed on a board-side of the package substrate 110 that is opposite to the chip-side of the package substrate 110. The solder balls 110b may allow the package assembly 100 to be securely mounted on a substrate such as a printed circuit board (PCB) and electrically coupled to the substrate. The solder balls 110b may be electrically connected to the metal bonding pads 110a by the metal interconnects and through vias in the package substrate 110.

The interposer module 120 may be mounted by C4 bumps 121 on the metal bonding pads 110a in the package substrate 110. The interposer module 120 may include an interposer dielectric layer 122 that may include metal interconnects 122a connected to the C4 bumps 121. The interposer module 120 may also include a first semiconductor die 123, second semiconductor die 124 and a third semiconductor die 125 that may all be mounted on the interposer dielectric layer 122.

The first semiconductor die 123, second semiconductor die 124 and third semiconductor die 125 may be mounted on the interposer dielectric layer 122 by micro-bumps 128 that may be electrically connected to the metal interconnects 122a. A package underfill layer 129 may be formed under and around the interposer module 120 and the C4 bumps 121 so as to fix the interposer module 120 to the package substrate 110. The package underfill layer 129 may be formed of an epoxy-based polymeric material.

Each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 126 may be formed around the micro-bumps 128 and between the first semiconductor die 123 and the interposer dielectric layer 122, between the second semiconductor die 124 and the interposer dielectric layer 122, and between the third semiconductor die 125 and the interposer dielectric layer 122. The interposer underfill layer 126 may be formed as three separate portions under the first semiconductor die 123, second semiconductor die 124 and third semiconductor die 125, respectively, as illustrated in FIG. 1A. Alternatively, the interposer underfill layer 126 may be formed continuously as one layer under all of the first semiconductor die 123, second semiconductor die 124 and third semiconductor die 125. The interposer underfill layer 126 may also be formed between first semiconductor die 123 and the second semiconductor die 124, and between the second semiconductor die 124 and the third semiconductor die 125. The interposer underfill layer 126 may also be formed of an epoxy-based polymeric material.

A molding material layer 127 may be formed over the first semiconductor die 123, the second semiconductor die 124, the third semiconductor die 125, the interposer underfill layer 126 and the interposer dielectric layer 122. The molding material layer 127 may be formed of an epoxy molding compound (EMC).

The TIM film 140 may be formed on the interposer module 120 to dissipate of heat generated during operation of the package assembly 100 (e.g., operation of first semiconductor die 123, second semiconductor die 124, and third semiconductor die). The TIM film 140 may be attached to the interposer module 120, for example, by a thermally conductive adhesive. In particular, the TIM film 140 may contact an upper surface of first semiconductor die 123, an upper surface of second semiconductor die 124, an upper surface of the third semiconductor die 125, and an upper surface of the molding material layer 127. The TIM film 140 may have a low bulk thermal impedance and high thermal conductivity. The bond-line-thickness (BLT) (e.g., a distance between the package lid 130 and the interposer module 120) may be less than about 100 μm, although greater or lesser distances may be used.

The package assembly 100 may also include a stiffener ring (not shown) that may be fixed to the package substrate 110 by an adhesive (e.g., a silicone adhesive or an epoxy adhesive). The stiffener ring may be formed of a metal such as copper with a nickel coating, or an aluminum alloy. The stiffener ring may be formed on the package substrate 110 so as to encircle the interposer module 120. The stiffener ring may provide rigidity to the package substrate 110.

The package lid 130 may be on the TIM film 140 and may provide a cover for the interposer module 120. The package lid 130 may contact at least a portion of the TIM film 140. In one or more embodiments, the package lid 130 may directly contact an entire upper surface of the TIM film 140. The package lid 130 may be formed, for example, of metal, ceramic or polymer material. The package lid 130 may include a plate portion 130d that may cover the interposer module 120. The plate portion 130d may include a central region that is formed over a central portion of the interposer module 120. A bottom surface 130d1 of the plate portion 130d may extend across most of the plate portion 130d and contact the TIM film 140.

The package lid 130 may also include an outer foot 130a and inner foot 130b that may extend from the plate portion 130d (e.g., in the z direction in FIG. 1A) and connect the package lid 130 to the package substrate 110 by an adhesive 160. That is, the adhesive 160 may fix the outer foot 130a to the package substrate 110 and the inner foot 130b to the package substrate 110.

The inner foot 130b may extend from the plate portion 130d inside the outer foot 130a. That is, the inner foot 130b may be located between the outer foot 130a and the interposer module 120 in the x-direction in FIG. 1A. A distance (in the x-direction in FIG. 1A) between the inner foot 130b and the interposer module 120 (e.g., the edge of the underfill 129) may generally be greater than 1 mm. The inner foot 130b may be integrally joined to the outer foot 130a, so that the inner foot 130b and outer foot 130a may be formed as a unit and have a step configuration. The inner foot 130b may have a width that is greater than or equal to a width of the outer foot 130a. In particular, the outer foot may 130a may have a width in a range from 0.5 mm to 6 mm, and the inner foot 130b may have a width in a range from 1 mm to 10 mm.

The inner foot 130b may have a length (e.g., from the bottom surface 130d1 of the plate portion 130d) that is less than a length of the outer foot 130a. That is, the outer foot 130a may extend from the plate portion 130d by a first distance, and the inner foot 130b may extend from the plate portion 130d by a second distance, wherein the second distance is less than the first distance. The difference between the first distance and the second distance may be, for example, in a range of 50 μm to 300 μm. The inner foot 130b may be formed on the outer foot 130a of the package lid 130, for example, by milling using a computer numerical control (CNC) milling machine, or by molding, punching or stamping the package lid 130 to include the inner foot 130b.

The adhesive 160 may include, for example, an epoxy adhesive or silicone adhesive. Other adhesives are within the contemplated scope of this disclosure. The adhesive 160 may include an adhesive outer portion 160a that adheres the outer foot 130a to the package substrate 110, and an adhesive inner portion 160b that adheres the inner foot 130b to the package substrate 110. The adhesive outer portion 160a may have a first thickness at the outer foot 130a, and the adhesive inner portion 160b may have a second thickness at the inner foot 130b, wherein the second thickness may be greater than the first thickness. A difference between the first thickness of the adhesive outer portion 1601 and the second thickness of the adhesive inner portion 160b may be, for example, in a range of 50 μm to 300 μm. A combined width of the adhesive outer portion 160a and adhesive inner portion 160b (after curing) may be substantially the same as a combined width of the outer foot 130a and inner foot 130b.

The package assembly 100 including the inner foot 130b and outer foot 130a may provide the package lid 130 with several advantages. First, a thicker adhesive 160b at the inner foot 130b may act as stress buffer and reduce the risk of delamination of the TIM 140 from between the interposer module 120 and package lid 130, and reduce the risk of delamination of the adhesive 160 from the package substrate 110. Second, the novel design may not require the purchase of new tooling, so that there may be almost no cost added by the addition of the inner foot 130b. Third, the novel design may reduce the COP of the package assembly 100. Fourth, the novel design may improve the RA performance of the package assembly 100.

Figure 1C:
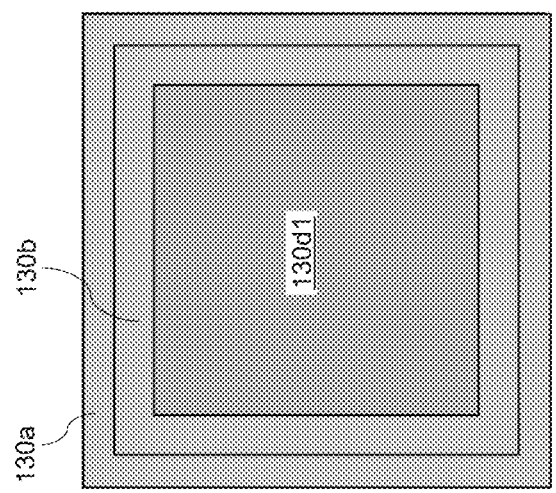
FIG. 1C is a plan view of the bottom surface of the plate portion of the package lid according to one or more embodiments.
Figure 1B:
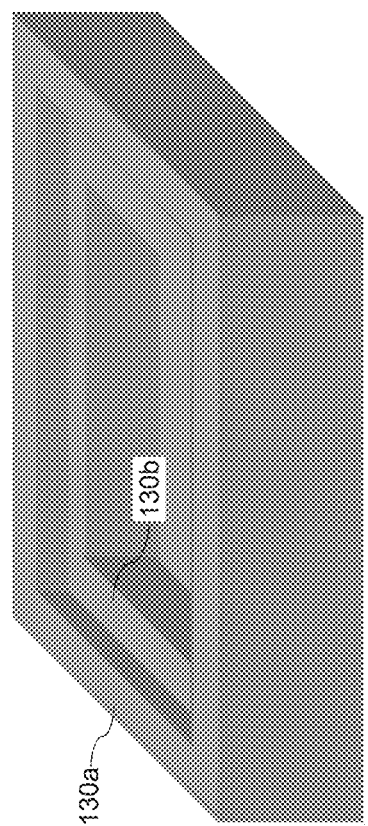
FIG. 1B is a perspective view of the package lid according to one or more embodiments.

FIG. 1B is a perspective view of the package lid 130 (that has been inverted) according to one or more embodiments. FIG. 1C is a plan view of the bottom surface 130d1 of the plate portion 130d of the package lid 130 according to one or more embodiments. As illustrated in FIGS. 1B and 1C, the package lid 130 may have a square shape or rectangle shape. Other suitable shapes of the package lid 130 may be within the contemplated scope of disclosure. For example, the package lid 130 may have a circular, oval, hexagonal, octagonal, polygonal shape. The inner foot 130b may be formed inside the outer foot 130a around the entire perimeter of the bottom surface 130d1 of the plate portion 130d. The outer foot 130a may be formed around the entire outer perimeter of the inner foot 130b. The bottom surface 130d1 of the plate portion 130d may be bounded on all sides by the inner foot 130b and may therefore, have a shape that corresponds to (e.g., is substantially the same as) the shape of the inner foot 130b (i.e., a square shape as shown in FIG. 1C).

Figure 2A:
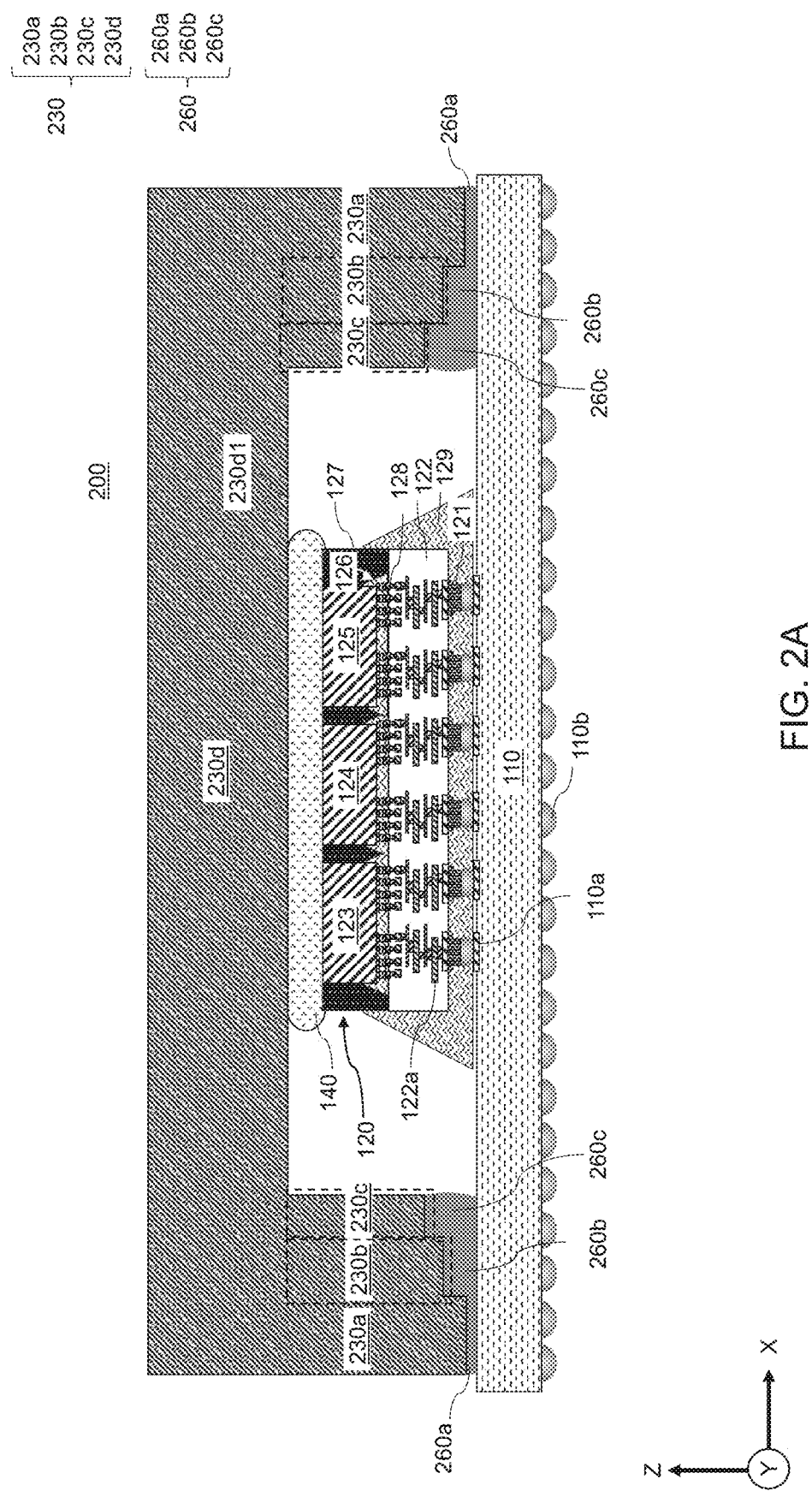
FIG. 2A is a vertical cross-sectional view of a package assembly (e.g., organic/silicon interposer package) according to one or more embodiments.

FIG. 2A is a vertical cross-sectional view of a package assembly 200 (e.g., organic/silicon interposer package) according to one or more embodiments. The package assembly 200 may be substantially similar to the package assembly 100 illustrated in FIGS. 1A-1C, except that package assembly 200 may include package lid 230 instead of package lid 130, and adhesive 260 instead of adhesive 160.

The package assembly 200 may include the package substrate 110, the interposer module 120 mounted on the package substrate 110, and the package lid 230 on the interposer module 120 and attached to the package substrate 110. The package assembly 200 may also include the TIM film 140 formed on the interposer module 120.

As noted above, each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

The TIM film 140 may be formed on the interposer module 120 to dissipate of heat generated during operation of the package assembly 200 (e.g., operation of first semiconductor die 123, second semiconductor die 124, and third semiconductor die). The TIM film 140 may have a low bulk thermal impedance and high thermal conductivity. The bond-line-thickness (BLT) (e.g., a distance between the package lid 230 and the interposer module 120) may be less than about 100 μm, although greater or lesser distances may be used.

The package lid 230 may be on the TIM film 140 and may provide a cover for the interposer module 120. The package lid 230 may contact at least a portion of the TIM film 140. In one or more embodiments, the package lid 230 may directly contact an entire upper surface of the TIM film 140. The package lid 230 may be formed, for example, of metal, ceramic or polymer material. The package lid 230 may include a plate portion 230d that may cover the interposer module 120. The plate portion 230d may include a central region that is formed over a central portion of the interposer module 120. A bottom surface 230d1 of the plate portion 230d may extend across most of the plate portion 230d and contact the TIM film 140.

The package lid 230 may also include an outer foot 230a, a first inner foot 230b, and a second inner foot 230c that may all extend from the plate portion 230d (e.g., in the z direction in FIG. 2A) and connect the package lid 230 to the package substrate 110 by an adhesive 260. That is, the adhesive 260 may adhere the outer foot 230a to the package substrate 110, adhere the first inner foot 230b to the package substrate 110, and adhere the second inner foot 230c to the package substrate 110.

The first inner foot 230b may extend from the plate portion 230d inside the outer foot 230a. That is, the first inner foot 230b may be located between the outer foot 230a and the interposer module 120 in the x-direction in FIG. 2A. The first inner foot 230b may be integrally joined to the outer foot 230a, so that the first inner foot 230b and outer foot 230a may be formed as a unit and have a step configuration. The first inner foot 230b may have a width that is greater than or equal to a width of the outer foot 230a. In particular, the outer foot 230a may have a width in a range from 0.5 mm to 6 mm, and the inner foot 230b may have a width in a range from 1 mm to 10 mm.

The first inner foot 230b may have a length (e.g., from the bottom surface 230d1 of the plate portion 230d) that is less than a length of the outer foot 230a. That is, the outer foot 230a may extend from the plate portion 230d by a first distance, and the first inner foot 230b may extend from the plate portion 230d by a second distance less than the first distance. The difference between the first distance and the second distance may be, for example, in a range of 50 μm to 300 μm. The first inner foot 230b may be formed on the outer foot 230a of the package lid 230, for example, by milling using a computer numerical control (CNC) milling machine, or by molding, punching or stamping the package lid 230 to include the first inner foot 230b.

The second inner foot 230c may extend from the plate portion inside the first inner foot 230b. That is, the second inner foot 230c may be located between the first inner foot 230b and the interposer module 120 in the x-direction in FIG. 2A. A distance (in the x-direction in FIG. 2A) between the second inner foot 230c and the interposer module 120 (e.g., the edge of the underfill 129) may generally be greater than 1 mm. The second inner foot 230c may be integrally joined to the first inner foot 230b and the outer foot 230a, so that the second inner foot 230c, first outer foot 230b and outer foot 230a may be formed as a unit and have a multi-step configuration. The second inner foot 230c may have a width that is greater than or equal to a width of the first inner foot 230b, and greater than or equal to a width of the outer foot 230a. The second inner foot 230c may have a length (e.g., from the bottom surface 230d1 of the plate portion 230d) that is less than a length of the first inner foot 230b. That is, the first inner foot 230b may extend from the plate portion 230d by a second distance, and the second inner foot 230c may extend from the plate portion 230d by a third distance less than the first distance. The difference between the second distance and the third distance may be, for example, in a range of 50 μm to 300 μm. The second inner foot 230c may be formed on the first inner foot 230b of the package lid 230, for example, by milling using a computer numerical control (CNC) milling machine, or by molding, punching or stamping the package lid 230 to include the second inner foot 230c.

The adhesive 260 may include, for example, epoxy adhesive or silicone adhesive. Other adhesives are within the contemplated scope of this disclosure. The adhesive 260 may include an adhesive outer portion 260a that adheres the outer foot 230a to the package substrate 110, first adhesive inner portion 260b that adheres the first inner foot 230b to the package substrate 110, and a second adhesive inner portion 260c that adheres the second inner foot 230c to the package substrate 110. The adhesive outer portion 260a may have a first thickness at the outer foot 230a, the first adhesive inner portion 260b may have a second thickness at the first inner foot 230b, and the second thickness may be greater than the first thickness. A difference between the first thickness and the second thickness may be, for example, in a range of 50 μm to 300 μm. The second adhesive inner portion 260c may have a third thickness at the second inner foot 230c, and the third thickness may be greater than the second thickness. A difference between the second thickness and the third thickness may be, for example, in a range of 50

μm to 300 μm. A combined width of the adhesive outer portion 260a, first adhesive inner portion 260b and second adhesive inner portion 260c (after curing) may be substantially the same as a combined width of the outer foot 230a, first inner foot 230b and second inner foot 230c.

The package assembly 200 including the first inner foot 230b and second inner foot 230c may provide the package lid 230 with several advantages. First, a thicker adhesive at the first inner foot 230b and second inner foot 230c may act as stress buffer and reduce the risk of delamination of the TIM 140 from between the interposer module 120 and package lid 230, and reduce the risk of delamination of the adhesive 260 from the package substrate 110. Second, the novel design may not require the purchase of new tooling, so that there may be almost no cost added by the addition of the first inner foot 230b and second inner foot 230c. Third, the novel design may reduce the COP of the package assembly 200. Fourth, the novel design may improve the RA performance of the package assembly 200.

Figure 2C:
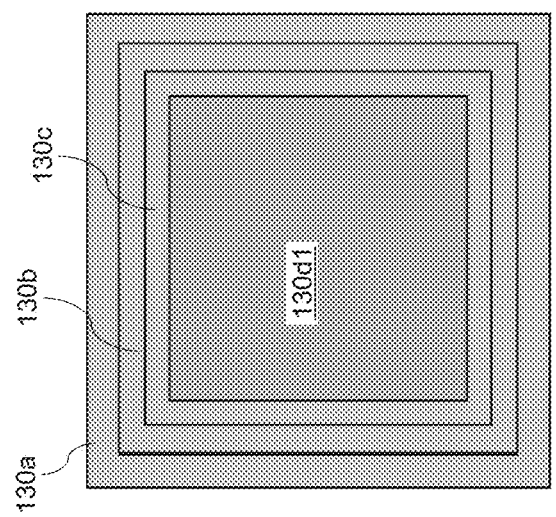
FIG. 2C is a plan view of the bottom surface of the plate portion of the package lid according to one or more embodiments.
Figure 2B:
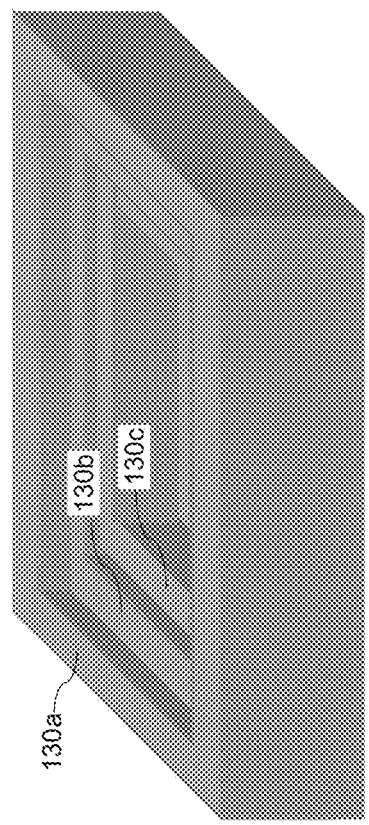
FIG. 2B is a perspective view of the package lid according to one or more embodiments.

FIG. 2B is a perspective view of the package lid 230 according to one or more embodiments. FIG. 2C is a plan view of the bottom surface 230d1 of the plate portion 230d of the package lid 230 according to one or more embodiments. As illustrated in FIGS. 2B and 2C, the package lid 230 may have a square shape or rectangle shape. As noted above, other suitable shapes of the package lid 230 may be within the contemplated scope of disclosure. The second inner foot 230c may be formed inside the first inner foot 230b around the entire perimeter of the bottom surface 230d1 of the plate portion 230d. The first inner foot 230b may be formed inside the outer foot 230a around the entire perimeter of the second inner foot 230c. The outer foot 230a may be formed around the entire outer perimeter of the first inner foot 230b. The bottom surface 230d1 of the plate portion 230d may be bounded on all sides by the second inner foot 230c and may therefore, have a shape that corresponds to (e.g., is substantially the same as) the shape of the second inner foot 230c (i.e., a square shape as shown in FIG. 2C).

Figure 3:
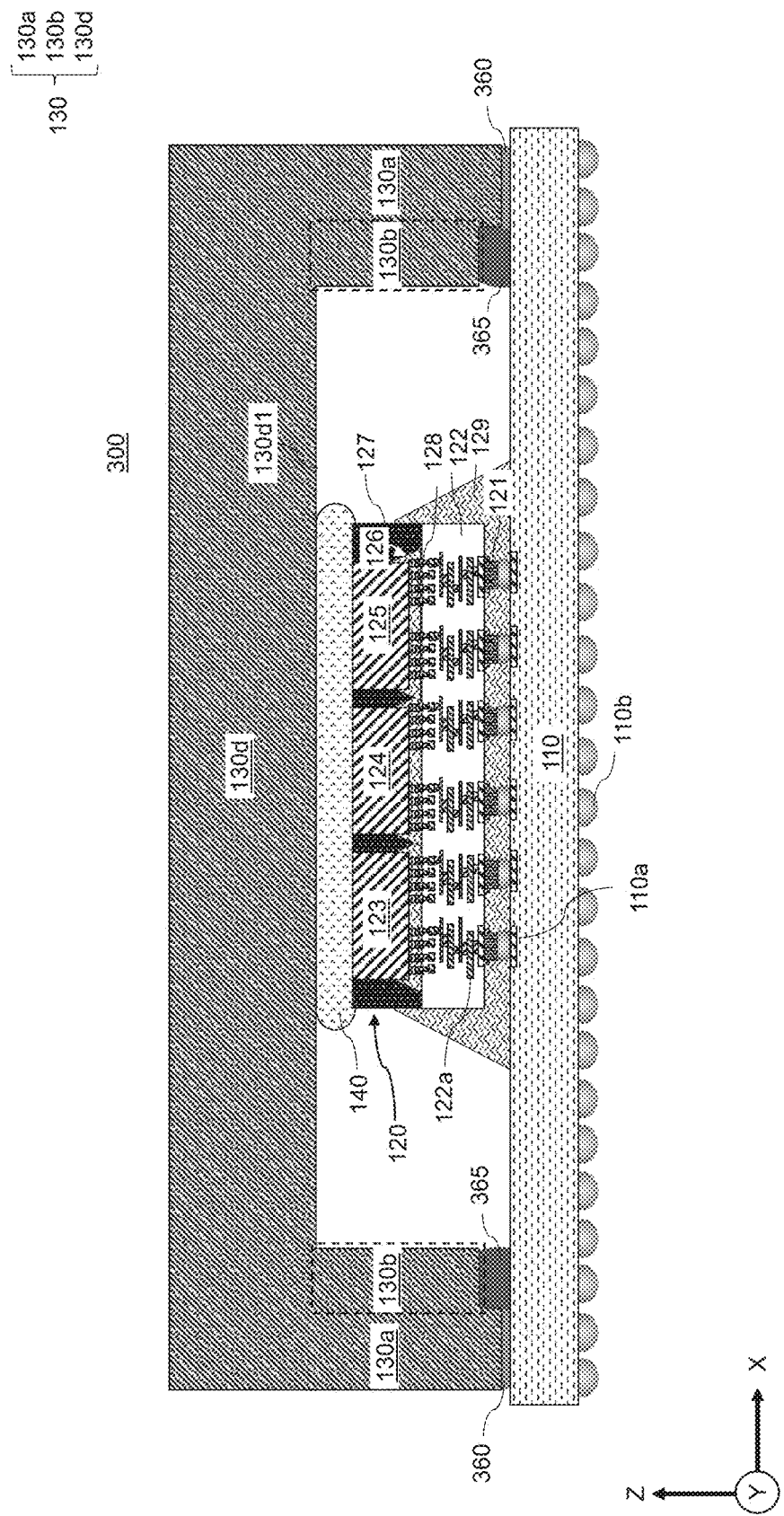
FIG. 3 is a vertical cross-sectional view of a package assembly (e.g., organic/silicon interposer package) according to one or more embodiments.

FIG. 3 is a vertical cross-sectional view of a package assembly 300 (e.g., organic/silicon interposer package) according to one or more embodiments. The package assembly 300 may be substantially similar to the package assembly 100 illustrated in FIGS. 1A-1C, except that package assembly 300 may include a first adhesive 360 and second adhesive 365 for fixing the package lid 130 to the package substrate 110, instead of adhesive 160.

The package assembly 300 may include the package substrate 110, the interposer module 120 mounted on the package substrate 110, and the package lid 130 on the interposer module 120 and attached to the package substrate 110. The package assembly 100 may also include the TIM film 140 formed on the interposer module 120.

The package lid 130 may also include the outer foot 130a and inner foot 130b that may extend from the plate portion 130d (e.g., in the z direction in FIG. 3) and connect the package lid 130 to the package substrate 110 by a first adhesive 360 and a second adhesive 365. That is, the first adhesive 360 may fix the outer foot 130a to the package substrate 110 and the second adhesive 365 may fix the inner foot 130b to the package substrate 110.

The first adhesive 360 may be different than the second adhesive 365 and may have different physical properties than the second adhesive 365. For example, the first adhesive 360 may differ from the second adhesive 365 in terms of elastic modulus, tensile strength, coefficient of thermal expansion, etc. In particular, the first adhesive 360 may have a first elastic modulus and the second adhesive 365 may have a second elastic modulus, wherein the second elastic modulus is less than the first elastic modulus. That is, an elongation of the first adhesive 360 may be less than an elongation of the second adhesive 365. For example, an elongation of the first adhesive 360 may be less than 10% and an elongation of the second adhesive 365 may be greater than 10%.

The first adhesive 360 may have a first thickness at the outer foot 130a, and the second adhesive 365 may have a second thickness at the inner foot 130b, wherein the second thickness may be greater than the first thickness. A difference between the first thickness and the second thickness may be, for example, in a range of 50 μm to 300 μm. A combined width of the first adhesive 360 and second adhesive 365 (after curing) may be substantially the same as the combined width of the outer foot 130a and inner foot 130b.

The package assembly 300 including the first adhesive 360 and second adhesive 365 may provide the package assembly 300 with several advantages. In particular, the second adhesive 365 having a greater thickness and lower elastic modulus at the inner foot 130b may act as stress buffer and reduce the risk of delamination of the TIM 140 from between the interposer module 120 and package lid 130, and reduce the risk of delamination of the first adhesive 360 and second adhesive 365 from the package substrate 110.

Figure 4A:
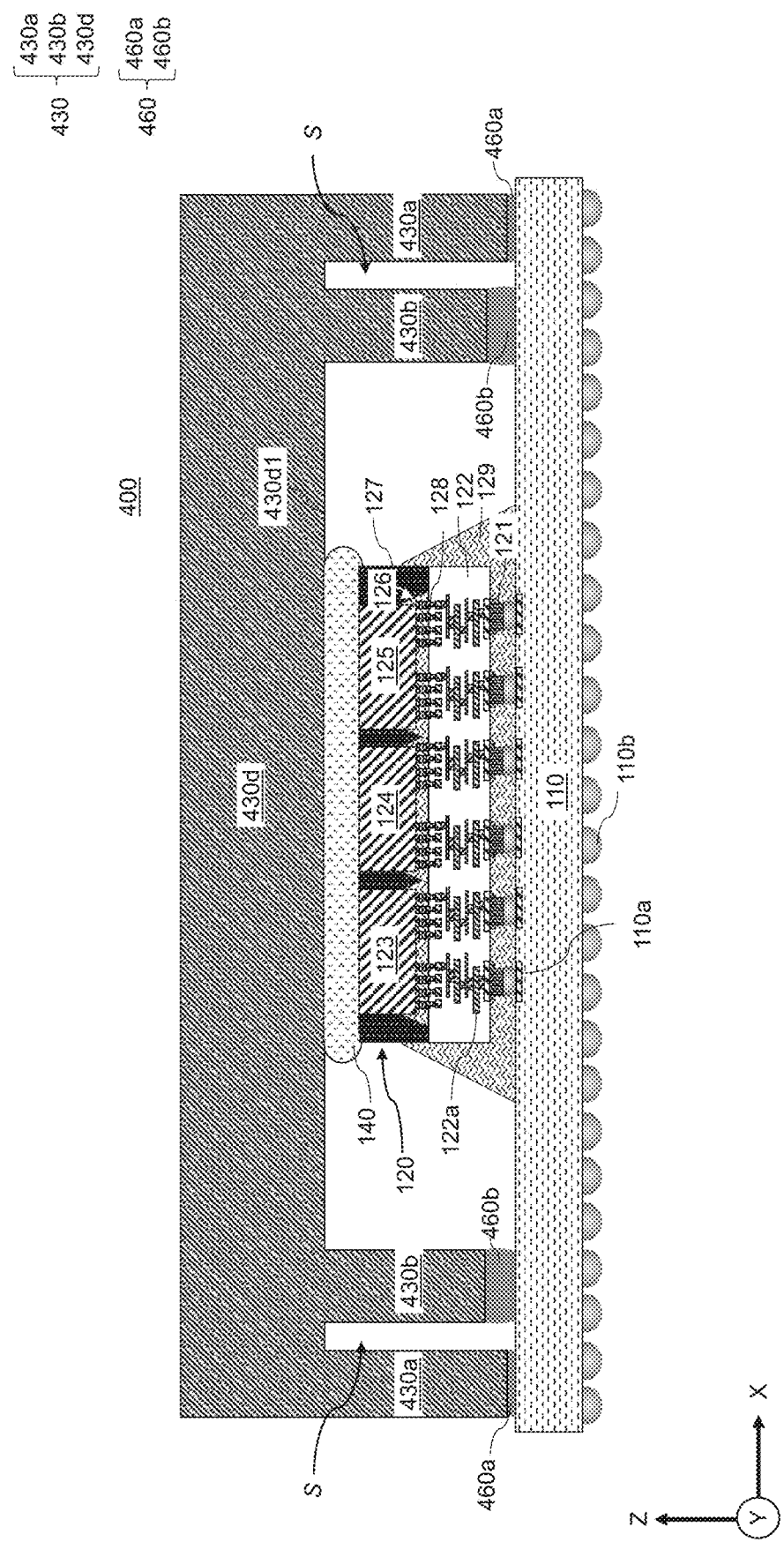
FIG. 4A is a vertical cross-sectional view of a package assembly (e.g., organic/silicon interposer package) according to one or more embodiments.

FIG. 4A is a vertical cross-sectional view of a package assembly 400 (e.g., organic/silicon interposer package) according to one or more embodiments. The package assembly 400 may be substantially similar to the package assembly 100 illustrated in FIGS. 1A-1C, except that package assembly 400 may include package lid 430 instead of package lid 130, and adhesive 460 instead of adhesive 160.

The package assembly 400 may include the package substrate 110, the interposer module 120 mounted on the package substrate 110, and the package lid 430 on the interposer module 120 and attached to the package substrate 110. The package assembly 400 may also include the TIM film 140 formed on the interposer module 120.

The package lid 430 may be on the TIM film 140 and may provide a cover for the interposer module 120. The package lid 430 may contact at least a portion of the TIM film 140. In one or more embodiments, the package lid 430 may directly contact an entire upper surface of the TIM film 140. The package lid 430 may be formed, for example, of metal, ceramic or polymer material. The package lid 430 may include a plate portion 430d that may cover the interposer module 120. The plate portion 430d may include a central region that is formed over a central portion of the interposer module 120. A bottom surface 430d1 of the plate portion 430d may extend across most of the plate portion 430d and contact the TIM film 140.

The package lid 430 may also include an outer foot 430a and inner foot 430b that may extend from the plate portion 430d (e.g., in the z direction in FIG. 4A) and connect the package lid 430 to the package substrate 110 by an adhesive 460. That is, the adhesive 460 may fix the outer foot 430a to the package substrate 110 and the inner foot 430b to the package substrate 110. Although the outer foot 430a and inner foot 430b are integrally formed with the plate portion 430d in FIG. 4A, in an alternative embodiment, either one or both of the outer foot 430a and inner foot 430b may consist of a ring that is separately formed from the plate portion 430d and attached to the plate portion 430d by an adhesive.

The inner foot 430b may extend from the plate portion 430d inside the outer foot 430a. That is, the inner foot 430b may be located between the outer foot 430a and the interposer module 120 in the x-direction in FIG. 4A. A distance (in the x-direction in FIG. 4A) between the inner foot 430b and the interposer module 120 (e.g., the edge of the underfill 129) may generally be greater than 1 mm. The inner foot 430b may be formed separately from the outer foot 430a so that a space S may be formed between the inner foot 430b and the outer foot 430a. A distance (in the x-direction in FIG. 4A) between the inner foot 430b and the outer foot 430a may generally be in a range from 0.2 mm to 10 mm, and may depend upon several factors such as a width (in the x-direction in FIG. 4A) of the plate portion 430d, a width of the inner foot 430b, a width of the outer foot 430a, etc.

The inner foot 430b may have a width that is greater than or equal to a width of the outer foot 430a. In particular, the outer foot 430a may have a width in a range from 0.5 mm to 6 mm, and the inner foot 430b may have a width in a range from 1 mm to 10 mm. The inner foot 430b may have a length (e.g., from the bottom surface 430d1 of the plate portion 430d) that is less than a length of the outer foot 430a. That is, the outer foot 430a may extend from the plate portion 430d by a first distance, and the inner foot 430b may extend from the plate portion 430d by a second distance, wherein the second distance is less than the first distance. The difference between the first distance and the second distance may be, for example, in a range of 50 μm to 300 μm. The inner foot 430b may be formed on the outer foot 430a of the package lid 430, for example, by milling using a computer numerical control (CNC) milling machine, or by molding, punching or stamping the package lid 430 to include the inner foot 430b.

It should be noted that although only one inner foot 430b is included in the package assembly 400, the package assembly 400 may include additional inner feet having lengths and widths that are the same as or different from the inner foot 430b. The additional inner feet may be integrally formed with the outer foot 430a and/or the inner foot 430b, or may be formed separately from the outer foot 430a and/or the inner foot 430b.

The adhesive 460 may include, for example, epoxy adhesive or silicone adhesive. Other adhesives are within the contemplated scope of this disclosure. The adhesive 460 may include an adhesive outer portion 460a that adheres the outer foot 430a to the package substrate 110, and an adhesive inner portion 460b that adheres the inner foot 430b to the package substrate 110. The adhesive outer portion 460a may have a first thickness at the outer foot 430a and the adhesive inner portion 460b may have a second thickness at the inner foot 430b, wherein the second thickness of the adhesive inner portion 460b may be greater than the first thickness of the adhesive outer portion 460a. A difference between the first thickness and the second thickness may be, for example, in a range of 50 μm to 300 μm. A width of the adhesive outer portion 460a (after curing) may be substantially the same as the width of the outer foot 430a, and a width of the adhesive inner portion 460b (after curing) may be substantially the same as the width of the inner foot 430b.

The package assembly 400 including the inner foot 430b and second inner foot (not shown) may provide the package lid 430 with several advantages. First, a thicker adhesive at the inner foot 430b and second inner foot (not shown) may act as stress buffer and reduce the risk of delamination of the TIM 140 from between the interposer module 120 and package lid 430, and reduce the risk of delamination of the adhesive 460 from the package substrate 110. Second, the novel design may not require the purchase of new tooling, so that there may be almost no cost added by the addition of the inner foot 430b and second inner foot (not shown). Third, the novel design may reduce the COP of the package assembly 400. Fourth, the novel design may improve the RA performance of the package assembly 400.

Figure 4C:
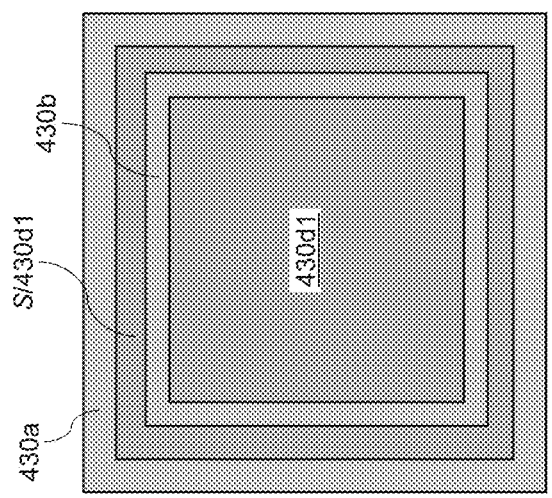
FIG. 4C is a plan view of the bottom surface of the plate portion of the package lid according to one or more embodiments.
Figure 4B:
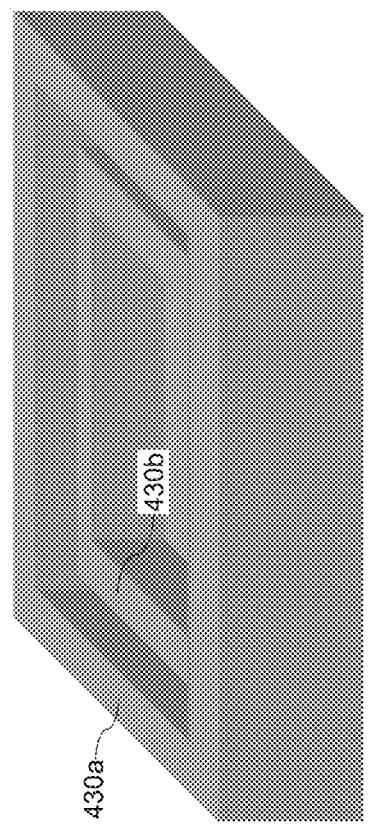
FIG. 4B is a perspective view of the package lid according to one or more embodiments.

FIG. 4B is a perspective view of the package lid 430 according to one or more embodiments. FIG. 4C is a plan view of the bottom surface 430d1 of the plate portion 430d of the package lid 430 according to one or more embodiments. As illustrated in FIGS. 4B and 4C, the package lid 430 may have a square shape or rectangle shape. As above, other suitable shapes of the package lid 430 may be within the contemplated scope of disclosure. The space S may be formed between the inner foot 430b and the outer foot 430a around the entire perimeter of the plate portion 430d. That is, the inner foot 430b may be formed inside the outer foot 430a around the entire perimeter of the plate portion 430d and separated by from the outer foot 430a around the entire outer perimeter of the plate portion 430d. A portion of the bottom surface 430d1 of the plate portion 430d may be exposed in the plan view of FIG. 4C in the space S between the inner foot 430b and the outer foot 430a.

Figure 5:
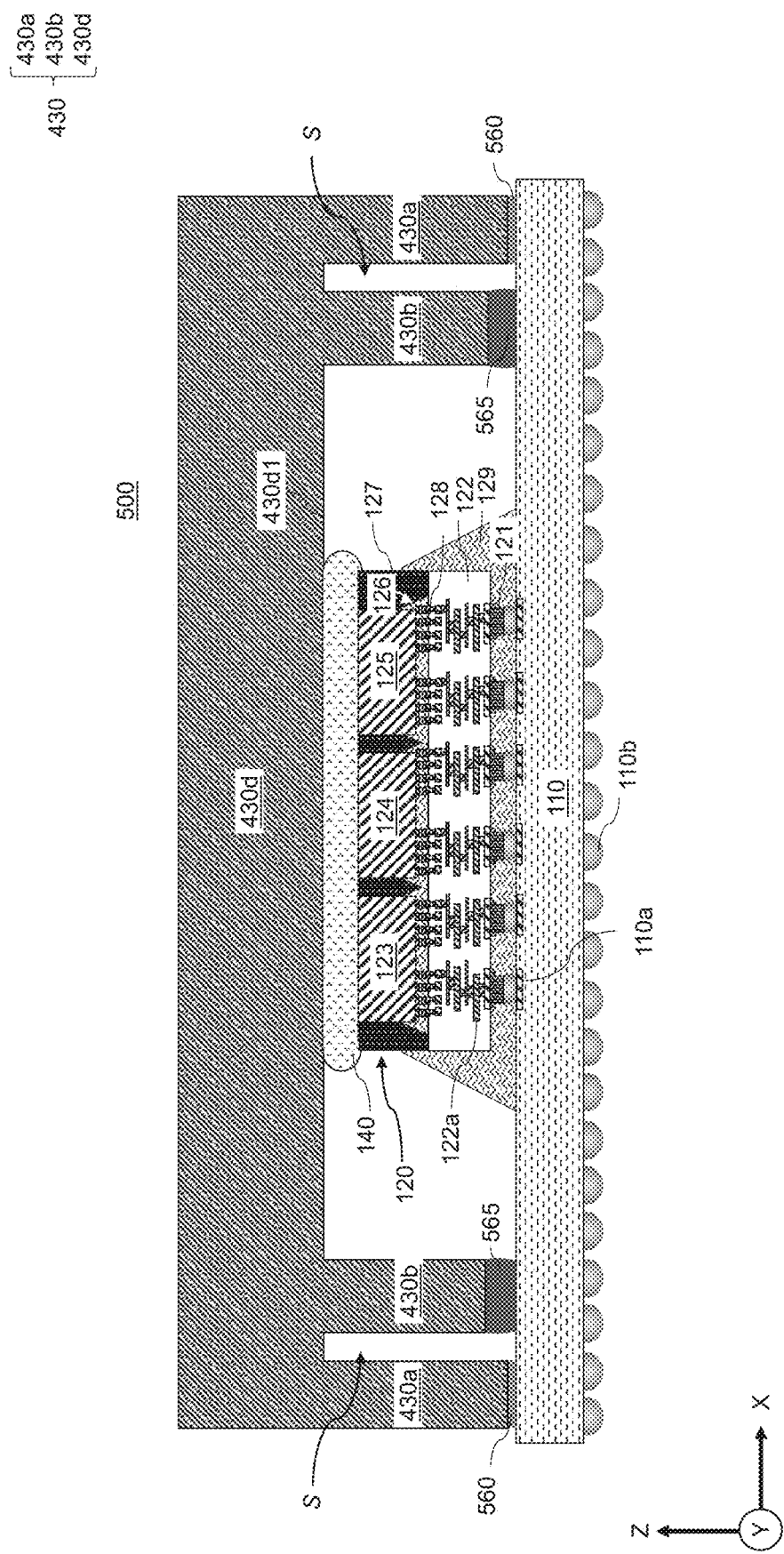
FIG. 5 is a vertical cross-sectional view of a package assembly (e.g., organic/silicon interposer package) according to one or more embodiments.

FIG. 5 is a vertical cross-sectional view of a package assembly 500 (e.g., organic/silicon interposer package) according to one or more embodiments. The package assembly 500 may be substantially similar to the package assembly 100 illustrated in FIGS. 4A-4C, except that package assembly 500 may include a first adhesive 560 and second adhesive 565 for fixing the package lid 430 to the package substrate 110, instead of adhesive 460.

The package assembly 500 may include the package substrate 110, the interposer module 120 mounted on the package substrate 110, and the package lid 430 on the interposer module 120 and attached to the package substrate 110. The package assembly 100 may also include the TIM film 140 formed on the interposer module 120.

The package lid 430 may include the outer foot 430a and inner foot 430b that may extend from the plate portion 430d (e.g., in the z direction in FIG. 5) and connect the package lid 430 to the package substrate 110 by a first adhesive 560 and a second adhesive 565. That is, the first adhesive 560 may adhere the outer foot 430a to the package substrate 110 and the second adhesive 565 may adhere the inner foot 430b to the package substrate 110. Although the outer foot 430a and inner foot 430b are integrally formed with the plate portion in FIG. 5, in an alternative embodiment, either one or both of the outer foot 430a and inner foot 430b may consist of a ring that is separately formed from the plate portion 430d and attached to the plate portion 430d by an adhesive.

The adhesive 560 may be different than the adhesive 565 and may have different physical properties than the adhesive 565. For example, the adhesive 560 may differ from the adhesive 565 in terms of elastic modulus, tensile strength, coefficient of thermal expansion, etc. In particular, the first adhesive 560 may have a first elastic modulus and the second adhesive 565 may have a second elastic modulus, wherein the second elastic modulus is less than the first elastic modulus. That is, an elongation of the first adhesive 560 may be less than an elongation of the second adhesive 565. For example, an elongation of the first adhesive 560 may be less than 10% and an elongation of the second adhesive 565 may be greater than 10%.

The first adhesive 560 may have a first thickness at the outer foot 430a, and the second adhesive 565 may have a second thickness at the inner foot 430b, wherein the second thickness of the adhesive 565 may be greater than the first thickness of the first adhesive 560. A difference between the first thickness of the first adhesive 560 and the second thickness of the adhesive 565 may be, for example, in a range of 50 μm to 300 μm. A width of the first adhesive 560 (after curing) may be substantially the same as the width of the outer foot 430*a*, and a width of the second adhesive 565 (after curing) may be substantially the same as the width of the inner foot 430*b*.

The package assembly 500 including the first adhesive 560 and second adhesive 565 may provide the package assembly 500 with several advantages. In particular, the second adhesive 565 having a greater thickness and lower elastic modulus at the inner foot 430*b* may act as stress buffer and reduce the risk of delamination of the TIM 140 from between the interposer module 120 and package lid 430, and reduce the risk of delamination of the first adhesive 560 and second adhesive 565 from the package substrate 110.

FIGS. 6A-6K illustrate various intermediate structures that may be formed during a method of making the package assembly 100 according to one or more embodiments. The method in FIGS. 6A-6K may be substantially the same as the method used to form the package assembly 200, package assembly 300, package assembly 400 and package assembly 500.

FIG. 6A illustrates a vertical cross-sectional view of an intermediate structure in which the interposer module 120 may be mounted on the package substrate 110 (e.g., via a flip chip bonding (FCB) process) according to one or more embodiments. As illustrated in FIG. 6A, the C4 bumps 121 of the interposer module 120 may be positioned on the metal bonding pads 110*a* of the package substrate 110 and heated in order to bond the C4 bumps 121 to the metal bonding pads 110*a*.

Figure 6B:
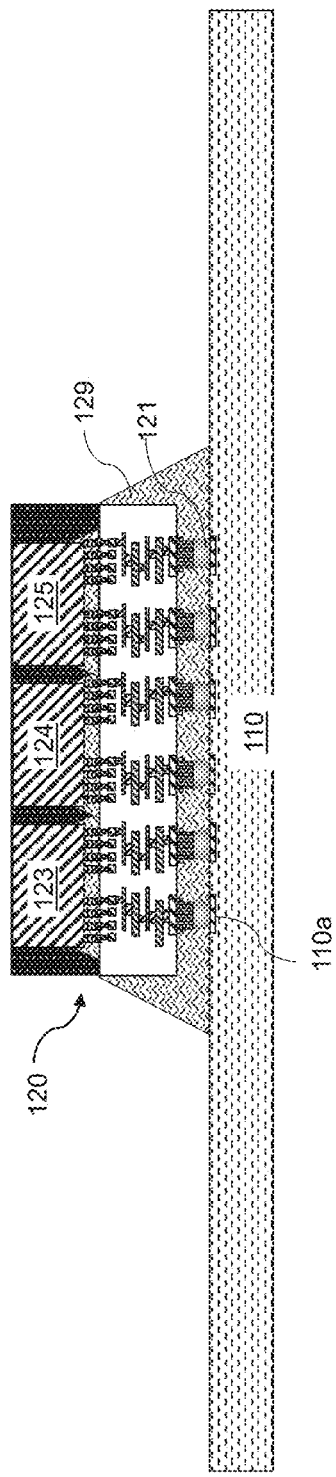
FIG. 6B illustrates a vertical cross-sectional view of an intermediate structure in which the package underfill layer may be formed on the package substrate according to one or more embodiments.

FIG. 6B illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 6B, the package underfill layer 129 may be formed under and around the interposer module 120 and the C4 bumps 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 6C:
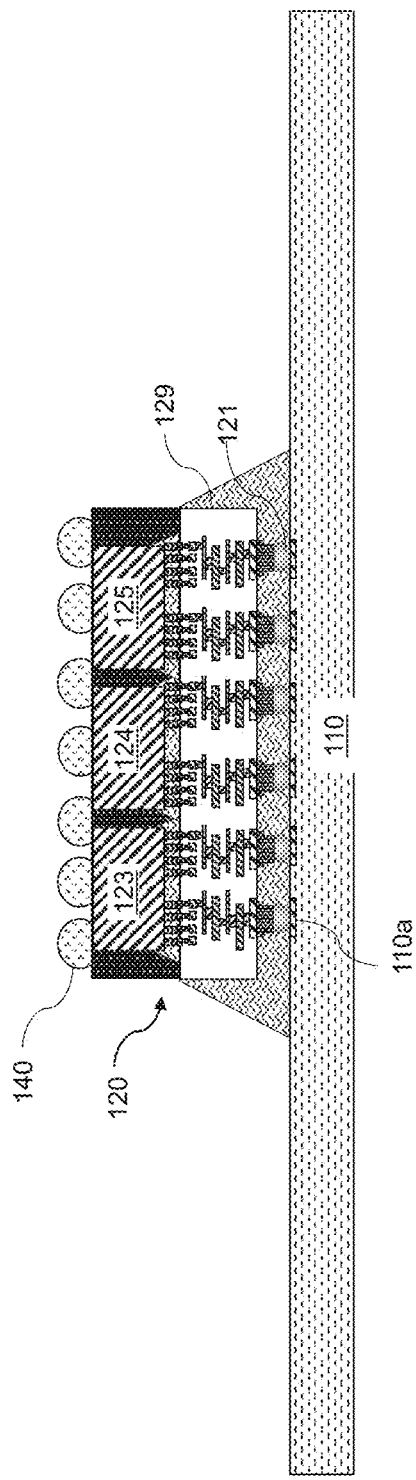
FIG. 6C illustrates a vertical cross-sectional view of an intermediate structure in which the TIM film may be formed on (e.g., dispensed on) or attached to the upper surface of the interposer module according to one or more embodiments.

FIG. 6C illustrates a vertical cross-sectional view of an intermediate structure in which the TIM film 140 may be formed on (e.g., dispensed on) or attached to the upper surface of the interposer module 120 according to one or more embodiments. The TIM film 140 may include, for example, a thermal paste, thermal adhesive, thermal gap filler, thermal pad (e.g., silicone), thermal tape, a graphite TIM film, and a carbon nanotube TIM film. The TIM film 140 may be attached to the upper surface of the interposer module 120 by using, for example, a thermally conductive adhesive.

Figure 6D:
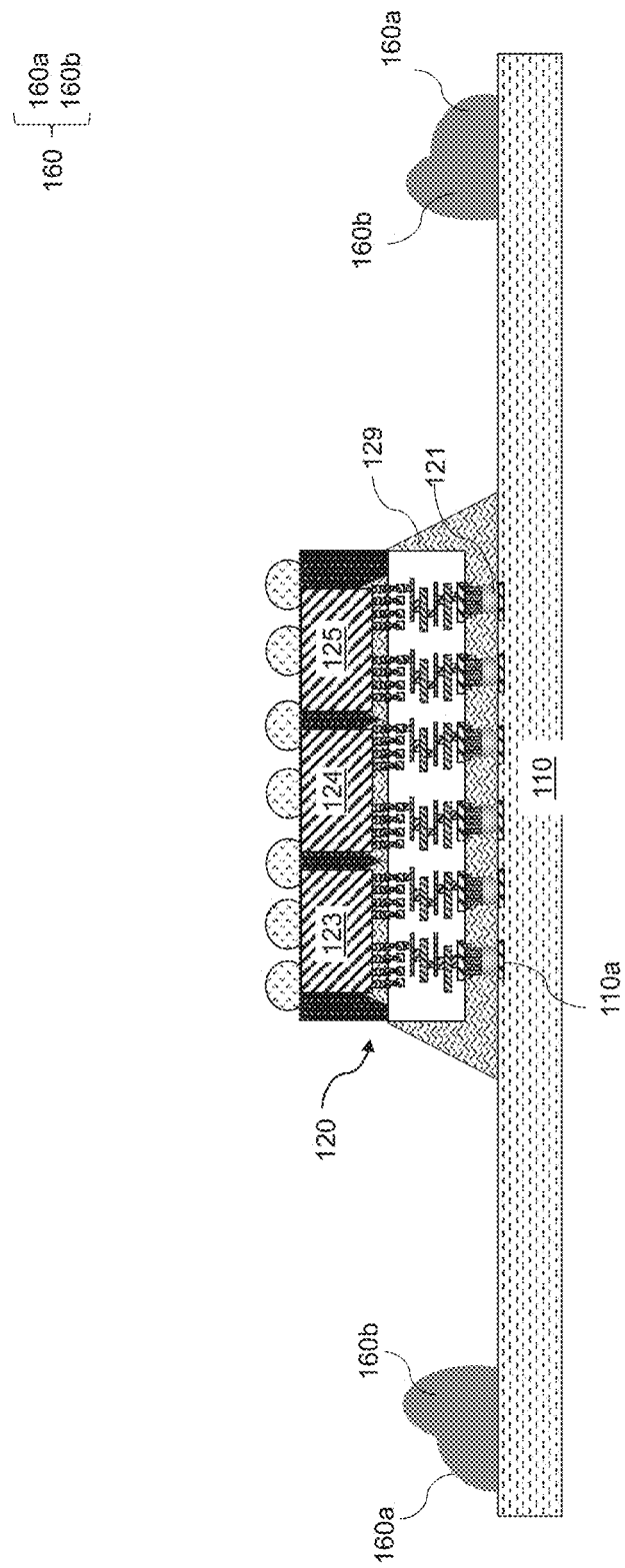
FIG. 6D illustrates a vertical cross-sectional view of an intermediate structure in which the adhesive may be applied to the package substrate according to one or more embodiments.

FIG. 6D illustrates a vertical cross-sectional view of an intermediate structure in which the adhesive 160 may be applied to the package substrate 110 according to one or more embodiments. The adhesive 160 may include, for example, a silicone adhesive or an epoxy adhesive. The adhesive may be located on the package substrate 110 at a position corresponding to a placement of the sidewall portions 130*b* of the package lid 130, and in a quantity sufficient to securely bond the package lid 130 to the package substrate 110. In particular, the adhesive 160 may be dispensed at a location and in an amount sufficient to form the adhesive outer portion 160*a* having a first thickness after pressing the package lid 130 onto the adhesive 160, and dispensed at a location and in an amount sufficient to form the adhesive inner portion 160*b* having a second thickness (greater than the first thickness) after pressing the package lid 130 onto the adhesive 160. The dispensed width of the adhesive outer portion 160*a* may be less than the ultimate width (after pressing on the package lid 130) of the adhesive outer portion 160*a*, and the dispensed width of the adhesive inner portion 160*b* may be less than the ultimate width (after pressing on the package lid 130) of the adhesive inner portion 160*b*. The dispensed thickness of the adhesive outer portion 160*a* may be greater than the ultimate thickness (after pressing on the package lid 130) of the adhesive outer portion 160*a*, and the dispensed thickness of the adhesive inner portion 160*b* may be less than the ultimate thickness (after pressing on the package lid 130) of the adhesive inner portion 160*b*.

FIGS. 6E-6I illustrate a plan view of an intermediate structure in which an adhesive for attaching a package lid has been dispensed onto the package substrate 110 for the package assembly 100, package assembly 200, package assembly 300, package assembly 400 and package assembly 500, respectively, according to one or more embodiments. The interposer module 120 has been omitted from FIGS. 6E-6I module for ease of understanding.

As illustrated in FIG. 6E, a first bead of the adhesive 160 may be formed continuously in a shape and location corresponding to a shape and location of the outer foot 130*a* of the package lid 130, so as to form the adhesive outer portion 160*a*. A second bead of the adhesive 160 may be formed continuously in a shape and location corresponding to a shape and location of the inner foot 130*b* of the package lid 130, so as to form the adhesive inner portion 160*b*. The second bead of adhesive 160 may have a thickness that is greater than a thickness of the first bead.

As illustrated in FIG. 6F, a first bead of the adhesive 260 may be formed continuously in a shape and location corresponding to a shape and location of the outer foot 230*a* of the package lid 230, so as to form the adhesive outer portion 260*a*. A second bead of the adhesive 160 may be formed continuously in a shape and location corresponding to a shape and location of the first inner foot 230*b* of the package lid 230, so as to form the first adhesive inner portion 260*b*. A third bead of the adhesive 260 may be formed continuously in a shape and location corresponding to a shape and location of the second inner foot 230*c* of the package lid 230, so as to form the second adhesive inner portion 260*c*. The second bead of adhesive 260 may have a thickness that is greater than a thickness of the first bead, and the third bead of adhesive 260 may have a thickness that is greater than a thickness of the second bead.

As illustrated in FIG. 6G, a bead of the first adhesive 360 may be formed continuously in a shape and location corresponding to a shape and location of the outer foot 130*a* of the package lid 130. A bead of the second adhesive 365 may be formed continuously in a shape and location corresponding to a shape and location of the inner foot 130*b* of the package lid 130. The bead of second adhesive 365 may have a thickness that is greater than a thickness of the bead of first adhesive 360.

As illustrated in FIG. 6H, a first bead of the adhesive 460 may be formed continuously in a shape and location corresponding to a shape and location of the outer foot 430*a* of the package lid 430, so as to form the adhesive outer portion 460a. A second bead of the adhesive 460 may be formed continuously in a shape and location corresponding to a shape and location of the inner foot 430b of the package lid 430, so as to form the adhesive inner portion 460b. The second bead of adhesive 460 may have a thickness that is greater than a thickness of the first bead.

As illustrated in FIG. 6I, a bead of the first adhesive 560 may be formed continuously in a shape and location corresponding to a shape and location of the outer foot 430a of the package lid 430. A bead of the second adhesive 565 may be formed continuously in a shape and location corresponding to a shape and location of the inner foot 430b of the package lid 430. The bead of second adhesive 565 may have a thickness that is greater than a thickness of the bead of first adhesive 560.

Figure 6J:
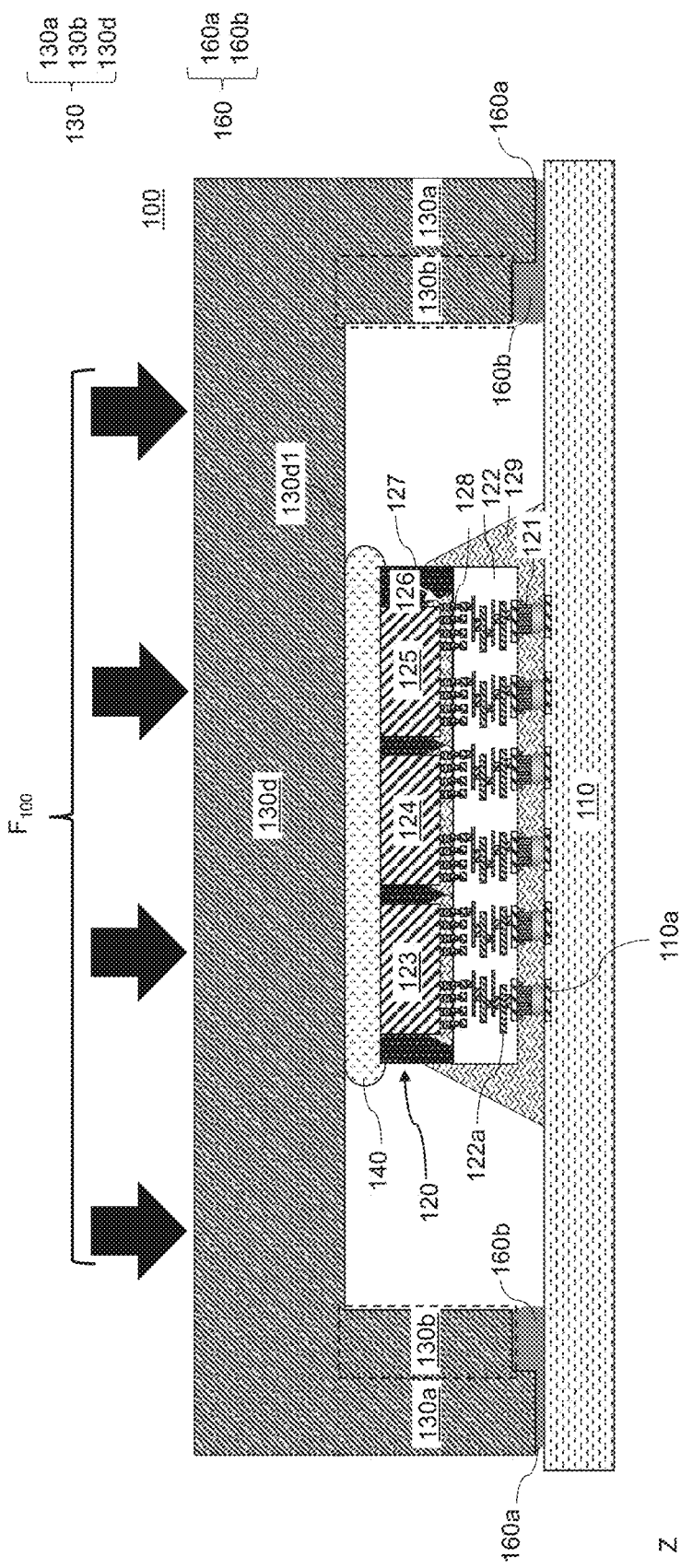

FIG. 6J illustrates a vertical cross-sectional view of an intermediate structure in which the package lid 130 may be attached to (e.g., mounted on) the package substrate 110 according to one or more embodiments. As noted above, the package lid 130 may be composed of metal, ceramic or plastic and may be formed, for example, by milling using a computer numerical control (CNC) milling machine, or by molding, punching or stamping the package lid 130 to include the bottom step region 130c.

In FIG. 6J, the package substrate 110 with the interposer module 120 may be placed on a surface and the package lid 130 lowered down over the interposer module 120 and onto the package substrate 110. The outer foot 130a of the package lid 130 may then be aligned with the adhesive outer portion 160a formed on the package substrate 110, and the inner foot 130b of the package lid 130 may be aligned with the adhesive inner portion 160b formed on the package substrate 110. The package lid 130 may then be pressed downward by applying a pressing force F100 down (in the z-direction in FIG. 6J) onto the package lid 130 so that the outer foot 130a and inner foot 130b of the package lid 130 may contact the package substrate 110 through the adhesive 160.

Alternatively, the package lid 130 may be inverted (e.g., flipped) and placed on a surface (e.g., a flat surface), and the interposer module 120 on the package substrate 110 may be inverted and inserted into the package lid 130. The package substrate 110 and interposer module 120 may then be pressed by applying a pressing force down into the package lid 130 so that the outer foot 130a and inner foot 130b of the package lid 130 may contact the package substrate 110 through the adhesive 160.

The package lid 130 may be clamped to the package substrate 110 for a period to allow the adhesive 160 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force F100 to the package lid 130.

Figure 6K:
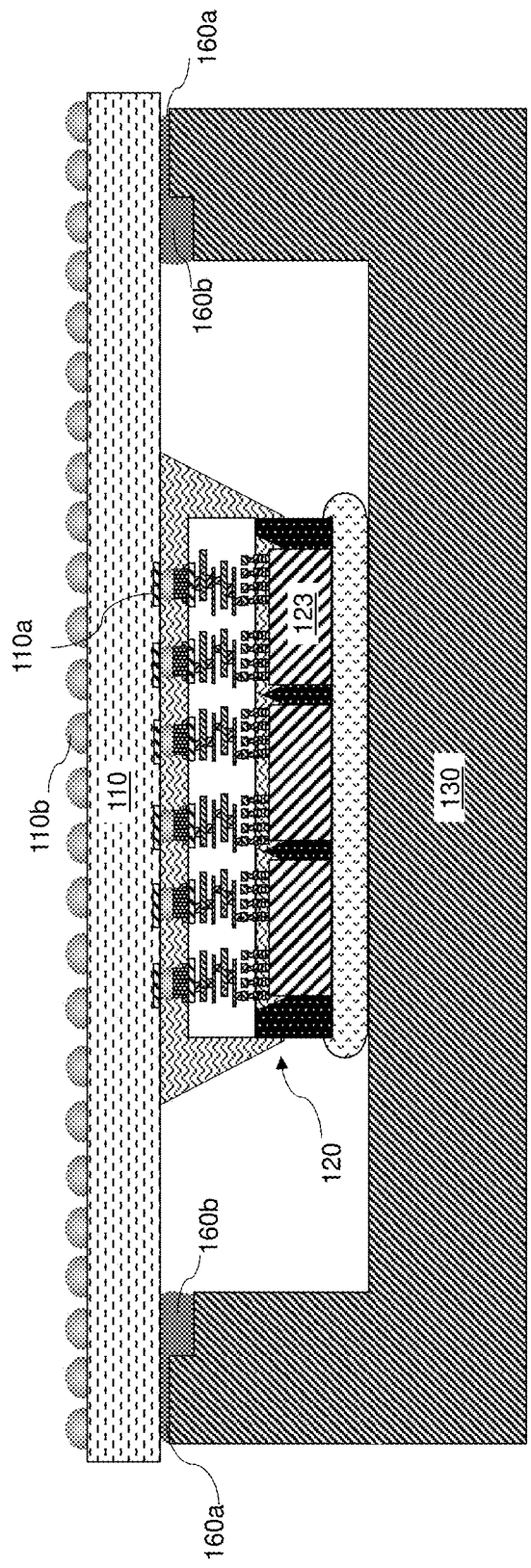

FIG. 6K illustrates a vertical cross-sectional view of an intermediate structure in which a plurality of solder balls 110b may be formed on the package substrate 110 according to one or more embodiments. The plurality of solder balls 110b may constitute a ball-grid array (BGA) that may allow the package assembly 100 to be securely mounted (e.g., by surface mount technology (SMT)) on a substrate such as a printed circuit board and electrically coupled to the substrate.

Figure 7:
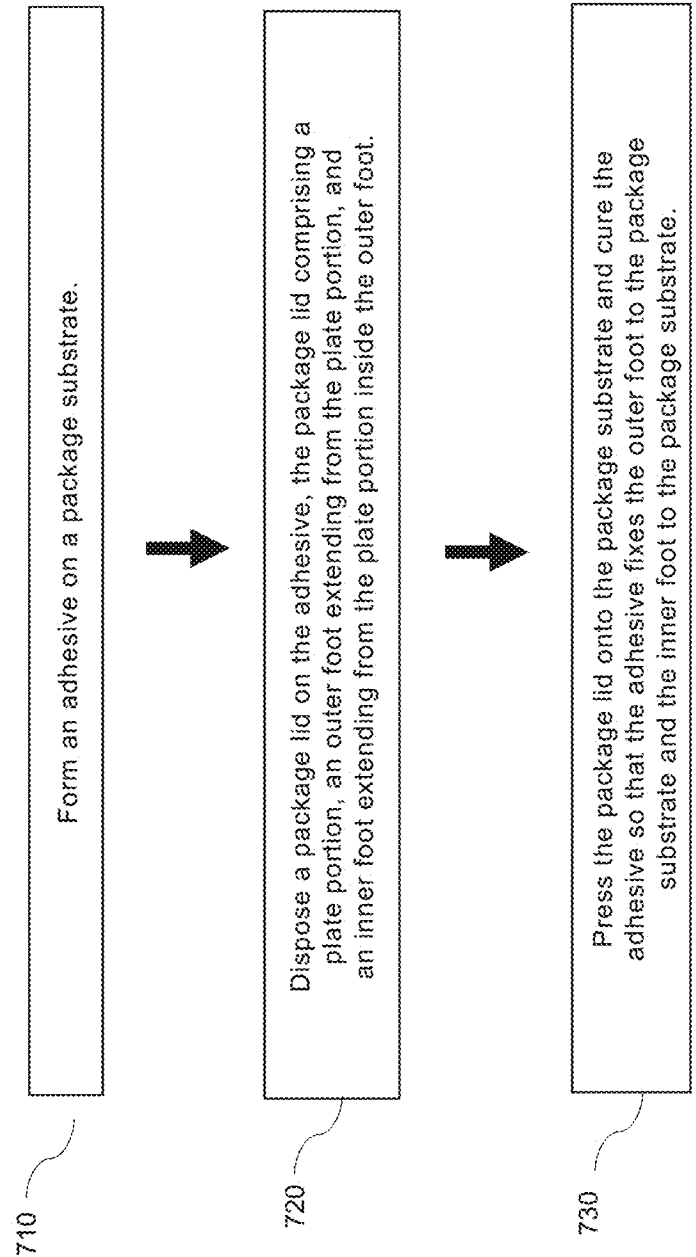
FIG. 7 is a flow chart illustrating a method of making a package assembly according to one or more embodiments.

FIG. 7 is a flow chart illustrating a method of making a package assembly according to one or more embodiments. Step 710 includes forming an adhesive on a package substrate. Step 720 includes disposing a package lid on the adhesive, the package lid comprising a plate portion, an outer foot extending from the plate portion, and an inner foot extending from the plate portion inside the outer foot. Step 730 includes pressing the package lid onto the package substrate and curing the adhesive so that the adhesive adheres the outer foot to the package substrate and the inner foot to the package substrate.

FIGS. 8A-14D illustrate various package assemblies having an interior inner foot that may be located between semiconductor devices on a package substrate. The interior inner foot may have a length that is greater than or equal to an outer foot in these package assemblies. In at least some of these package assemblies, the interior inner foot may be replaced with a dummy die having a length (e.g., height) that is greater than or equal to a length of the outer foot.

Figure 8C:
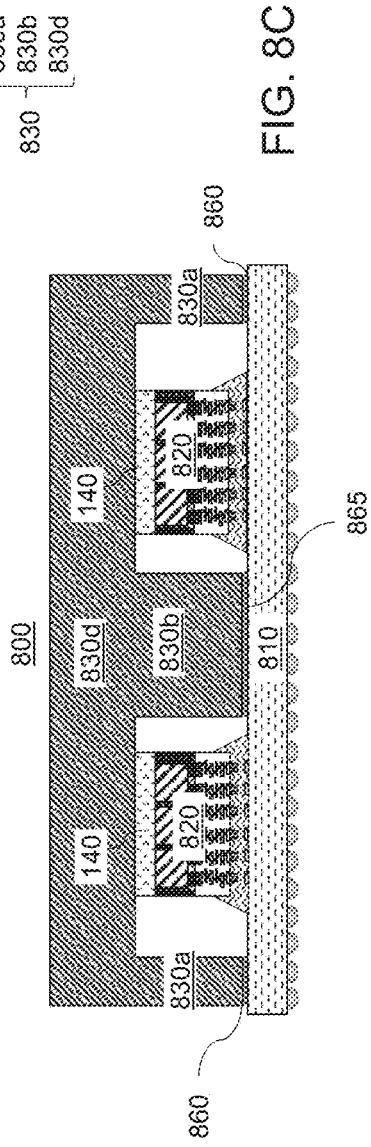
FIG. 8C is a vertical cross-sectional view of the package assembly according to one or more embodiments.
Figure 8D:
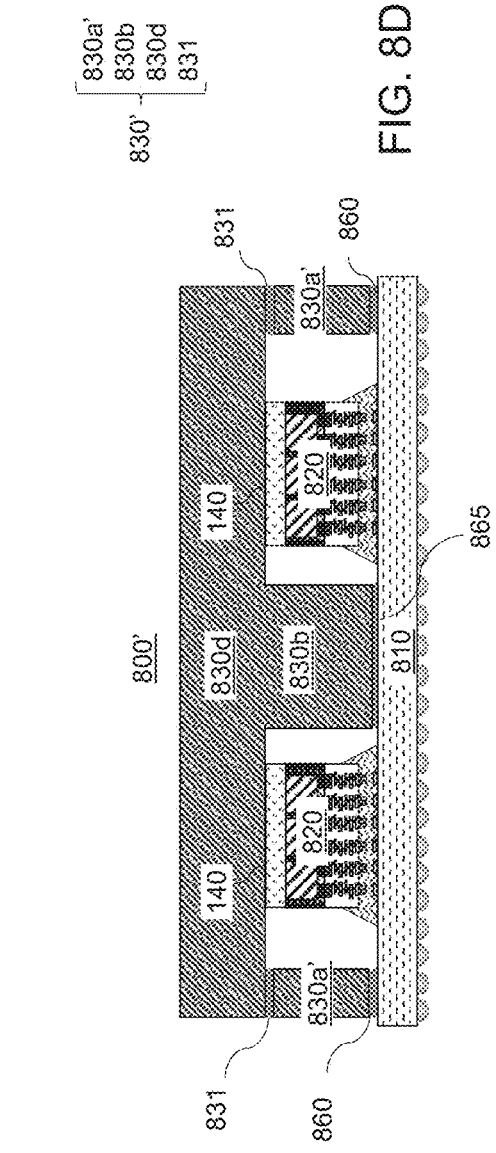
FIG. 8D is a vertical cross-sectional view of a package assembly according to one or more embodiments.
Figure 8A:
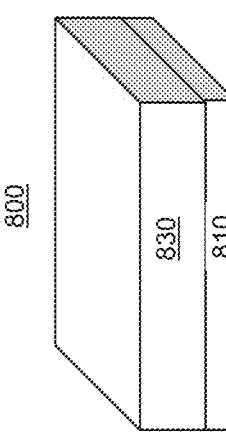
FIG. 8A is a perspective view of a package assembly according to one or more embodiments.

FIG. 8A is a perspective view of a package assembly 800 according to one or more embodiments. The package assembly 800 may include a substrate 810, and a package lid 830 on the substrate 810. The substrate 810 may include, for example, a printed circuit board (PCB), system on integrated substrate (SoIS), or a package substrate such as the package substrate 110. The package assembly 800 may include, for example, a COWOS device, a multi-chip module (MCM) device, or an integrated fan-out (InFO) large scale integrated (LSI) device. In particular, the package assembly 800 may include a novel package lid design for chiplet integration. The novel design may reduce a coefficient of performance (COP) for the package assembly 800 and improve an RA performance of the package assembly 800.

Figure 8B:
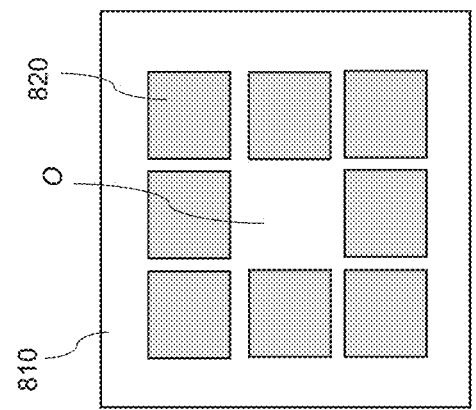
FIG. 8B illustrates an arrangement of a plurality of semiconductor devices on the substrate for the package assembly according to one or more embodiments.

FIG. 8B illustrates an arrangement of a plurality of semiconductor devices 820 on the substrate 810 for the package assembly 800 according to one or more embodiments. As illustrated in FIG. 8B, the arrangement of semiconductor devices 820 may include an opening O that may be reserved for the placement of an inner foot of a package lid 830. The semiconductor devices 820 may include, for example, a semiconductor chip, a chiplet, or an interposer module such as the interposer module 120. In one or more embodiments, the package assembly 800 may include a multi-chip module (MCM) in which case the package substrate 110 may include a printed circuit board (PCB) and the plurality of interposer modules 120 may include semiconductor chips and/or chiplets.

FIG. 8C is a vertical cross-sectional view of the package assembly 800 through line AA' in FIG. 8B, according to one or more embodiments. The package assembly 800 may include the substrate 810, the plurality of semiconductor devices 820 mounted on the substrate 810, and the package lid 830 on the semiconductor device 820 and attached to the substrate 810. A TIM film such as the TIM film 140 may be formed on the semiconductor devices 820.

The package lid 830 may include a plate portion 830d, and an outer foot 830a and inner foot 830b (e.g., interior inner foot) that may each extend from the plate portion 830d. The inner foot 830b may be formed separately from the outer foot 830a. The inner foot 830b may be formed between the semiconductor devices 820 and may be formed in a central portion of the package lid 830. The inner foot 830b may be formed at a location on the package lid 830 that corresponds to the opening O on the substrate 810 in FIG. 8A. A width of the inner foot 830b may be greater than or equal to a width of the outer foot 830a. In particular, the outer foot 830a may have a width in a range from 0.5 mm to 6 mm, and the inner foot 830b may have a width in a range from 1 mm to 10 mm. In at least one embodiment, the width of the inner foot 830b may be at least twice the width of the outer foot 830a.

The inner foot 830b may have a length (e.g., from a bottom surface of the plate portion 830d) that may be greater than or equal to a length of the outer foot 830a. That is, the outer foot 830a may extend from the plate portion 830d by a first distance, and the inner foot 830b may extend from the plate portion 830d by a second distance, wherein the second distance is greater than or equal to the first distance. The inner foot 830b and outer foot 830a may be formed on the package lid 830, for example, by milling using a computer numerical control (CNC) milling machine, or by molding, punching or stamping the package lid 830 to include the inner foot 830b and outer foot 830a.

The outer foot 830a may connect the package lid 830 to the substrate 810 by the first adhesive 860, and the inner foot 830b may connect the package lid 830 to the substrate 810 by the second adhesive 865. The first adhesive 860 and the second adhesive 865 may be similar to one of the adhesives described above such as adhesive 160, adhesive 365, etc. The first adhesive 860 may be the same as the second adhesive 865 or different (e.g., different physical properties) than the second adhesive 865. For example, the first adhesive 860 may be the same as or different from the second adhesive 865 in terms of elastic modulus, tensile strength, coefficient of thermal expansion, etc. In particular, the first adhesive 860 may have a first elastic modulus and the second adhesive 865 may have a second elastic modulus, wherein the second elastic modulus is less than the first elastic modulus. That is, an elongation of the first adhesive 860 may be less than an elongation of the second adhesive 865. For example, an elongation of the first adhesive 860 may be less than 10% and an elongation of the second adhesive 865 may be greater than 10%.

The first adhesive 860 may have a thickness that is greater than or equal to a thickness of the second adhesive 865. A width of the first adhesive 860 may be substantially the same as a width of the outer foot 830a and a width of the second adhesive 865 may be substantially the same as a width of the inner foot 830b. Further, a horizontal cross-sectional shape of the first adhesive 860 may be substantially the same as a horizontal cross-sectional shape of the outer foot 830a, and a horizontal cross-sectional shape of the second adhesive 865 may be substantially the same as horizontal cross-sectional shape of the inner foot 830b.

The package assembly 800 including the first adhesive 860 and second adhesive 865 may provide the package assembly 800 with several advantages. In particular, the second adhesive 865 may act as stress buffer and reduce the risk of delamination of the TIM film 140 from the semiconductor device 820 from between the semiconductor device 820 and package lid 830, and reduce the risk of delamination of the first adhesive 860 and second adhesive 865 from the substrate 810.

FIG. 8D is a vertical cross-sectional view of a package assembly 800' according to one or more embodiments. The package assembly 800' may be substantially the same as the package assembly 800, except that that instead of package lid 830 the package assembly 800' may include a package lid 830'.

The package lid 830' may be a two-piece package lid with a first piece that may include a plate portion 830d and the inner foot 830b that extends from the plate portion 830d, and a second piece that may include a separately-formed ring-shaped outer foot 830a' and an adhesive 831 that may attach the ring-shaped outer foot 830a' to the plate portion 830d. The separately-formed ring-shaped outer foot 830a' may be made of the same material as the outer foot 830a (i.e., the same material as the plate portion 830d) and otherwise substantially the same as the outer foot 830a. In particular, the separately-formed ring-shaped outer foot 830a' may be substantially the same as the outer foot 830a in terms of width, shape, length, etc. The adhesive 831 may be similar to one of the adhesives described above such as adhesive 160, adhesive 365, etc.

FIG. 9A is a perspective view of a package assembly 900 according to one or more embodiments. The package assembly 900 may include a substrate 910, and a package lid 930 on the substrate 910. The substrate 910 may include, for example, a printed circuit board (PCB), system on integrated substrate (SoIS), or a package substrate such as the package substrate 110. The package assembly 900 may include, for example, a COWOS device, a multi-chip module (MCM) device, or an integrated fan-out (InFO) large scale integrated (LSI) device. The package lid 930 of the package assembly 900 may include a novel design for chiplet integration. The novel design may reduce a coefficient of performance (COP) for the package assembly 900 and improve an RA performance of the package assembly 900.

FIG. 9B illustrates an arrangement of a plurality of semiconductor devices 920 on the substrate 910 for the package assembly 900 according to one or more embodiments. As illustrated in FIG. 9B, the arrangement of semiconductor devices 920 may include an opening O that may be reserved for the placement of an inner foot of a package lid 930. A plurality of passive components 925 such as multi-layer ceramic capacitors (MLCCs) and integrated passive components may be also be formed on the substrate 910 adjacent to the semiconductor devices 920.

The semiconductor devices 920 may include, for example, a semiconductor chip, a chiplet, or an interposer module such as the interposer module 120. In one or more embodiments, the package assembly 900 may include a multi-chip module (MCM) (e.g., a 36-chip MCM device) in which case the package substrate 110 may include a printed circuit board (PCB) and the plurality of interposer modules 120 may include semiconductor chips and/or chiplets.

FIG. 9C is a perspective view of the package lid 930 according to one or more embodiments. As illustrated in FIG. 9C, the package lid 930 may a plate portion 930d, and an outer foot 930a and inner foot 930b (e.g., interior inner foot) that may each extend from the plate portion 930d. The inner foot 930b may include four parts that may have a similar size and shape and may be in the form of a sight (e.g., reticle) (e.g., a sight-shaped inner foot 930b).

The four parts of the inner foot 930b may be adjoined to an inner wall of the outer foot 930a and extend longitudinally from the inner wall of the outer foot 930. The four parts of the inner foot 930b may each be arranged perpendicularly to the inner wall of the outer foot 930a. The inner foot 930b may be formed between the semiconductor devices 920 and may be formed outside of a central portion of the package lid 930. The inner foot 930b may be formed at a location on the package lid 930 that corresponds to the opening O on the substrate 910 in FIG. 9A. A width of the four parts of the inner foot 930b may be greater than or equal to a width of the outer foot 930a. In particular, the outer foot 930a may have a width in a range from 0.5 mm to 6 mm, and the inner foot 930b may have a width in a range from 1 mm to 10 mm.

The inner foot 930b may have a length (e.g., from a bottom surface of the plate portion 930d) that may be greater than or equal to a length of the outer foot 930a. That is, the outer foot 930a may extend from the plate portion 930d by a first distance, and the inner foot 930b may extend from the plate portion 930d by a second distance greater than or equal to the first distance. The inner foot 930b and outer foot 930a may be formed on the package lid 930, for example, by milling using a computer numerical control (CNC) milling machine, or by molding, punching or stamping the package lid 930 to include the inner foot 930b and outer foot 930a. Both the outer foot 930a and the inner foot 930b may connect the package lid 930 to the substrate 910 by an adhesive.

FIG. 9D is an exploded perspective view of a package lid 930' that may be substituted for the package lid 930 in the package assembly 900 according to one or more embodiments. The package lid 930' may be substantially the same as the package lid 930, except that the package lid 930' may be a two-piece package lid. The two-piece package lid 930' may include a first piece that may include a plate portion 930d and the inner foot 930b (e.g., sight-shaped inner foot 930b) that extends from the plate portion 930d. The two-piece package lid 930' may also include a second piece that may include a separately-formed ring-shaped outer foot 930a' that may be attached to the plate portion 930d by an adhesive. The separately-formed ring-shaped outer foot 930a' may be made of the same material as the outer foot 930a (i.e., the same material as the plate portion 930d) and otherwise substantially the same as the outer foot 930a. In particular, the separately-formed ring-shaped outer foot 930a' may be substantially the same as the outer foot 930a in terms of width, shape, length, etc. The adhesive for adhering the separately-formed ring-shaped outer foot 930a' to the plate portion may be similar to one of the adhesives described above such as adhesive 160, adhesive 365, etc.

Figure 10C:
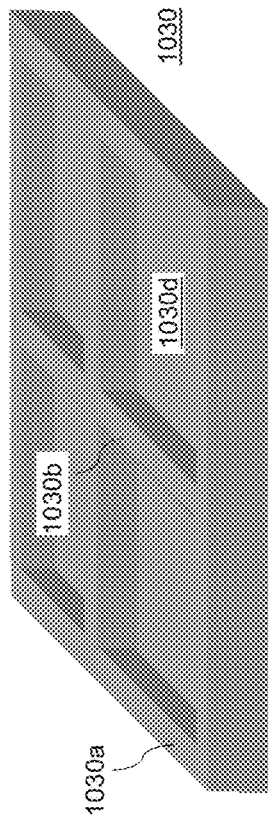
FIG. 10C is a perspective view of the package lid according to one or more embodiments.
Figure 10D:
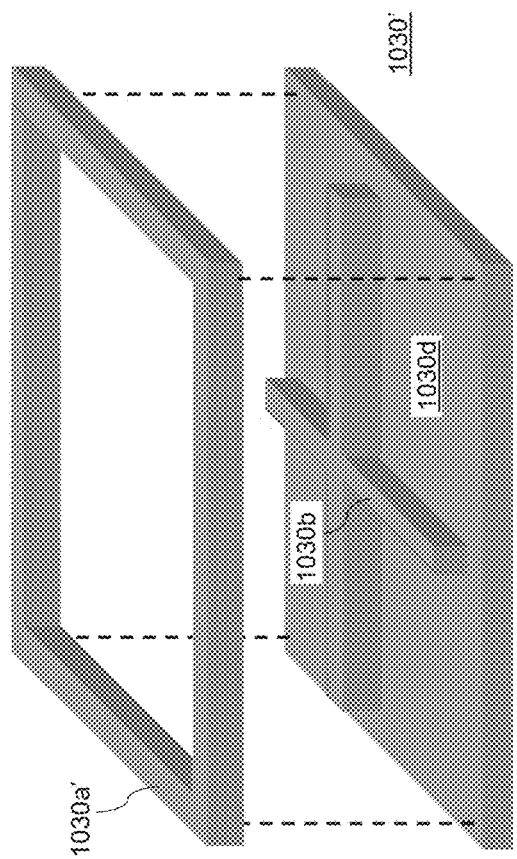
FIG. 10D is an exploded perspective view of the package lid that may be substituted for the package lid in the package assembly according to one or more embodiments.
Figure 10A:
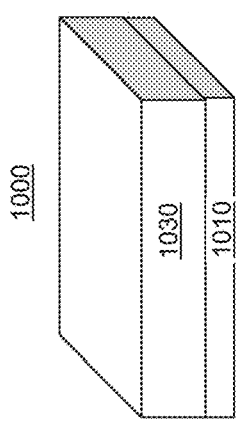
FIG. 10A is a perspective view of a package assembly according to one or more embodiments.

FIG. 10A is a perspective view of a package assembly 1000 according to one or more embodiments. The package assembly 1000 may include a substrate 1010, and a package lid 1030 on the substrate 1010. The substrate 1010 may include, for example, a printed circuit board (PCB), system on integrated substrate (SoIS), or a package substrate such as the package substrate 110. The package assembly 1000 may include, for example, a COWOS device, a multi-chip module (MCM) device, or an integrated fan-out (InFO) large scale integrated (LSI) device. The package lid 1030 of the package assembly 1000 may include a novel design for chiplet integration. The novel design may reduce a coefficient of performance (COP) for the package assembly 1000 and improve an RA performance of the package assembly 1000.

Figure 10B:
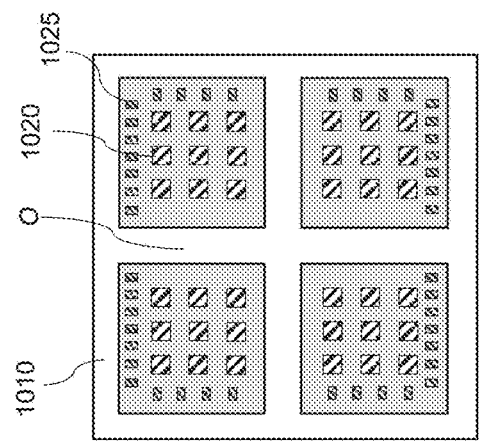
FIG. 10B illustrates an arrangement of a plurality of semiconductor devices on the substrate for the package assembly according to one or more embodiments.

FIG. 10B illustrates an arrangement of a plurality of semiconductor devices 1020 on the substrate 1010 for the package assembly 1000 according to one or more embodiments. As illustrated in FIG. 10B, the arrangement of semiconductor devices 1020 may include an opening O that may be reserved for the placement of an inner foot of a package lid 1030. A plurality of passive components 1025 such as multi-layer ceramic capacitors (MLCCs) and integrated passive components may be also be formed on the substrate 1010 adjacent to the semiconductor devices 1020.

The semiconductor devices 1020 may include, for example, a semiconductor chip, a chiplet, or an interposer module such as the interposer module 120. In one or more embodiments, the package assembly 1000 may include a multi-chip module (MCM) (e.g., a 36-chip MCM device) in which case the package substrate 110 may include a printed circuit board (PCB) and the plurality of interposer modules 120 may include semiconductor chips and/or chiplets.

FIG. 10C is a perspective view of the package lid 1030 according to one or more embodiments. As illustrated in FIG. 10C, the package lid 1030 may a plate portion 1030d, and an outer foot 1030a and inner foot 1030b (e.g., interior inner foot) that may each extend from the plate portion 1030d. The inner foot 1030b may have a shape of a cross/rib (e.g., a cross-shaped inner foot 1030b).

The inner foot 1030b may be adjoined to an inner wall of the outer foot 1030a. The inner foot 1030b may be formed between the semiconductor devices 1020 and an intersection point of the inner foot 1030b may be formed at a central portion of the package lid 1030. In particular, the inner foot 1030b may be formed at a location on the package lid 1030 that corresponds to the opening O on the substrate 1010 in FIG. 10A. A width of the inner foot 1030b may be greater than or equal to a width of the outer foot 1030a. In particular, the outer foot 1030a may have a width in a range from 0.5 mm to 6 mm, and the inner foot 1030b may have a width in a range from 1 mm to 10 mm.

The inner foot 1030b may have a length (e.g., from a bottom surface of the plate portion 1030d) that may be greater than or equal to a length of the outer foot 1030a. That is, the outer foot 1030a may extend from the plate portion 1030d by a first distance, and the inner foot 1030b may extend from the plate portion 1030d by a second distance greater than or equal to the first distance. The inner foot 1030b and outer foot 1030a may be formed on the package lid 1030, for example, by milling using a computer numerical control (CNC) milling machine, or by molding, punching or stamping the package lid 1030 to include the inner foot 1030b and outer foot 1030a. Both the outer foot 1030a and the inner foot 1030b may connect the package lid 1030 to the substrate 1010 by an adhesive.

FIG. 10D is an exploded perspective view of a package lid 1030' that may be substituted for the package lid 1030 in the package assembly 1000 according to one or more embodiments. The package lid 1030' may be substantially the same as the package lid 1030, except that the package lid 1030' may be a two-piece package lid. The two-piece package lid 1030' may include a first piece that may include a plate portion 1030d and the inner foot 1030b (e.g., cross-shaped inner foot 1030b) that extends from the plate portion 1030d. The two-piece package lid 1030' may also include a second piece that may include a separately-formed ring-shaped outer foot 1030a' that may be attached to the plate portion 1030d by an adhesive. The separately-formed ring-shaped outer foot 1030a' may be made of the same material as the outer foot 1030a (i.e., the same material as the plate portion 1030d) and otherwise substantially the same as the outer foot 1030a. In particular, the separately-formed ring-shaped outer foot 1030a' may be substantially the same as the outer foot 1030a in terms of width, shape, length, etc. The adhesive for connecting the separately-formed ring-shaped outer foot 1030a' to the plate portion may be similar to one of the adhesives described above such as adhesive 160, adhesive 365, etc.

Figure 11C:
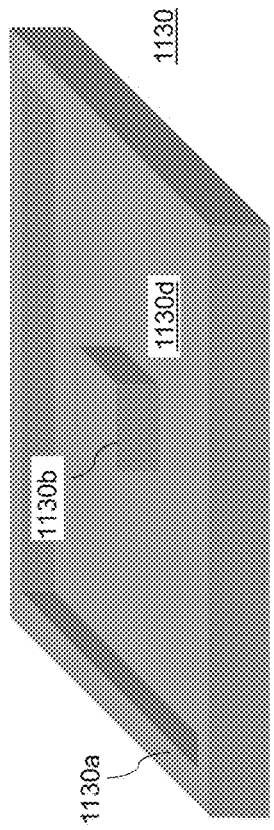
FIG. 11C is a perspective view of the package lid according to one or more embodiments.
Figure 11D:
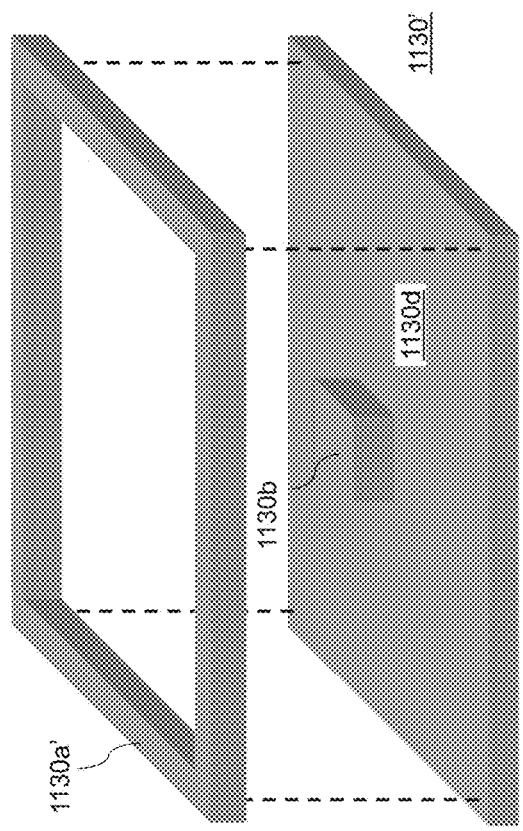
FIG. 11D is an exploded perspective view of the package lid that may be substituted for the package lid in the package assembly according to one or more embodiments.
Figure 11A:
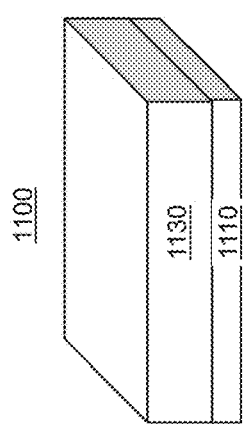
FIG. 11A is a perspective view of a package assembly according to one or more embodiments.

FIG. 11A is a perspective view of a package assembly 1100 according to one or more embodiments. The package assembly 1100 may include a substrate 1110, and a package lid 1130 on the substrate 1110. The substrate 1110 may include, for example, a printed circuit board (PCB), system on integrated substrate (SoIS), or a package substrate such as the package substrate 110. The package assembly 1100 may include, for example, a COWOS device, a multi-chip module (MCM) device, or an integrated fan-out (InFO) large scale integrated (LSI) device. The package lid 1130 of the package assembly 1100 may include a novel design for chiplet integration. The novel design may reduce a coefficient of performance (COP) for the package assembly 1100 and improve an RA performance of the package assembly 1100.

Figure 11B:
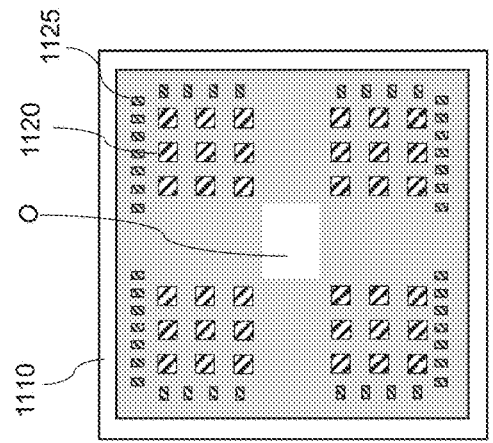
FIG. 11B illustrates an arrangement of a plurality of semiconductor devices on the substrate for the package assembly according to one or more embodiments.

FIG. 11B illustrates an arrangement of a plurality of semiconductor devices 1120 on the substrate 1110 for the package assembly 1100 according to one or more embodiments. As illustrated in FIG. 11B, the arrangement of semiconductor devices 1120 may include an opening O that may be reserved for the placement of an inner foot of a package lid 1130. A plurality of passive components 1125 such as multi-layer ceramic capacitors (MLCCs) and integrated passive components may be also be formed on the substrate 1110 adjacent to the semiconductor devices 1120.

The semiconductor devices 1120 may include, for example, a semiconductor chip, a chiplet, or an interposer module such as the interposer module 120. In one or more embodiments, the package assembly 1100 may include a multi-chip module (MCM) (e.g., a 36-chip MCM device) in which case the package substrate 110 may include a printed circuit board (PCB) and the plurality of interposer modules 120 may include semiconductor chips and/or chiplets.

FIG. 11C is a perspective view of the package lid 1130 according to one or more embodiments. As illustrated in FIG. 11C, the package lid 1130 may a plate portion 1130*d*, and an outer foot 1130*a* and inner foot 1130*b* (e.g., interior inner foot) that may each extend from the plate portion 1130*d*. The inner foot 1130*b* may have a shape of a square cylindrical column or island (e.g., a column-shaped inner foot 1130*b*).

The inner foot 1130*b* may be adjoined to an inner wall of the outer foot 1130*a*. The inner foot 1130*b* may be formed between the semiconductor devices 1120 and an intersection point of the inner foot 1130*b* may be formed at a central portion of the package lid 1130. In particular, the inner foot 1130*b* may be formed at a location on the package lid 1130 that corresponds to the opening O on the substrate 1110 in FIG. 11A. A width of the inner foot 1130*b* may be greater than or equal to a width of the outer foot 1130*a*. In particular, the outer foot 1130*a* may have a width in a range from 0.5 mm to 6 mm, and the inner foot 1130*b* may have a width in a range from 1 mm to 10 mm.

The inner foot 1130*b* may have a length (e.g., from a bottom surface of the plate portion 1130*d*) that may be greater than or equal to a length of the outer foot 1130*a*. That is, the outer foot 1130*a* may extend from the plate portion 1130*d* by a first distance, and the inner foot 1130*b* may extend from the plate portion 1130*d* by a second distance greater than or equal to the first distance. The inner foot 1130*b* and outer foot 1130*a* may be formed on the package lid 1130, for example, by milling using a computer numerical control (CNC) milling machine, or by molding, punching or stamping the package lid 1130 to include the inner foot 1130*b* and outer foot 1130*a*. Both the outer foot 1130*a* and the inner foot 1130*b* may connect the package lid 1130 to the substrate 1110 by an adhesive.

FIG. 11D is an exploded perspective view of a package lid 1130' that may be substituted for the package lid 1130 in the package assembly 1100 according to one or more embodiments. The package lid 1130' may be substantially the same as the package lid 1130, except that the package lid 1130' may be a two-piece package lid. The two-piece package lid 1130' may include a first piece that may include a plate portion 1130*d* and the inner foot 1130*b* (e.g., column-shaped inner foot 1130*b*) that extends from the plate portion 1130*d*. The two-piece package lid 1130' may also include a second piece that may include a separately-formed ring-shaped outer foot 1130*a*' that may be attached to the plate portion 1130*d* by an adhesive. The separately-formed ring-shaped outer foot 1130*a*' may be made of the same material as the outer foot 1130*a* (i.e., the same material as the plate portion 1130*d*) and otherwise substantially the same as the outer foot 1130*a*. In particular, the separately-formed ring-shaped outer foot 1130*a*' may be substantially the same as the outer foot 1130*a* in terms of width, shape, length, etc. The adhesive for connecting the separately-formed ring-shaped outer foot 1130*a*' to the plate portion may be similar to one of the adhesives described above such as adhesive 160, adhesive 365, etc.

FIG. 12A is a perspective view of a package assembly 1200 according to one or more embodiments. The package assembly 1200 may include a substrate 1210, and a package lid 1230 on the substrate 1210. The substrate 1210 may include, for example, a printed circuit board (PCB), system on integrated substrate (SoIS), or a package substrate such as the package substrate 120. The package assembly 1200 may include, for example, a COWOS device, a multi-chip module (MCM) device, or an integrated fan-out (InFO) large scale integrated (LSI) device. The package lid 1230 of the package assembly 1200 may include a novel design for chiplet integration. The novel design may reduce a coefficient of performance (COP) for the package assembly 1200 and improve an RA performance of the package assembly 1200.

FIG. 12B illustrates an arrangement of a plurality of semiconductor devices 1220 on the substrate 1210 for the package assembly 1200 according to one or more embodiments. As illustrated in FIG. 12B, the arrangement of semiconductor devices 1220 may include an opening O that may be reserved for the placement of an inner foot of a package lid 1230. A plurality of passive components 1225 such as multi-layer ceramic capacitors (MLCCs) and integrated passive components may be also be formed on the substrate 1210 adjacent to the semiconductor devices 1220.

The semiconductor devices 1220 may include, for example, a semiconductor chip, a chiplet, or an interposer module such as the interposer module 120. In one or more embodiments, the package assembly 1200 may include a multi-chip module (MCM) (e.g., a 36-chip MCM device) in which case the package substrate 120 may include a printed circuit board (PCB) and the plurality of interposer modules 120 may include semiconductor chips and/or chiplets.

FIG. 12C is a perspective view of the package lid 1230 according to one or more embodiments. As illustrated in FIG. 12C, the package lid 1230 may a plate portion 1230*d*, and an outer foot 1230*a* and inner foot 1230*b* (e.g., interior inner foot) that may each extend from the plate portion 1230*d*. The inner foot 1230*b* may have a shape of a small cross (e.g., a small cross-shaped inner foot 1230*b*).

The inner foot 1230*b* may be adjoined to an inner wall of the outer foot 1230*a*. The inner foot 1230*b* may be formed between the semiconductor devices 1220 and an intersection point of the inner foot 1230*b* may be formed at a central portion of the package lid 1230. In particular, the inner foot 1230*b* may be formed at a location on the package lid 1230 that corresponds to the opening O on the substrate 1210 in FIG. 12A. A width of the inner foot 1230*b* may be greater than or equal to a width of the outer foot 1230*a*. In particular, the outer foot 1230*a* may have a width in a range from 0.5 mm to 6 mm, and the inner foot 1230*b* may have a width in a range from 1 mm to 10 mm.

The inner foot 1230*b* may have a length (e.g., from a bottom surface of the plate portion 1230*d*) that may be greater than or equal to a length of the outer foot 1230*a*. That is, the outer foot 1230*a* may extend from the plate portion 1230*d* by a first distance, and the inner foot 1230*b* may extend from the plate portion 1230*d* by a second distance greater than or equal to the first distance. The inner foot 1230*b* and outer foot 1230*a* may be formed on the package lid 1230, for example, by milling using a computer numerical control (CNC) milling machine, or by molding, punching or stamping the package lid 1230 to include the inner foot 1230*b* and outer foot 1230*a*. Both the outer foot 1230*a* and the inner foot 1230*b* may connect the package lid 1230 to the substrate 1210 by an adhesive.

FIG. 12D is an exploded perspective view of a package lid 1230' that may be substituted for the package lid 1230 in the package assembly 1200 according to one or more embodiments. The package lid 1230' may be substantially the same as the package lid 1230, except that the package lid 1230' may be a two-piece package lid. The two-piece package lid 1230' may include a first piece that may include a plate portion 1230*d* and the inner foot 1230*b* (e.g., small cross-shaped inner foot 1230*b*) that extends from the plate portion 1230*d*. The two-piece package lid 1230' may also include a second piece that may include a separately-formed ring-shaped outer foot 1230*a*' that may be attached to the plate portion 1230*d* by an adhesive. The separately-formed ring-shaped outer foot 1230*a*' may be made of the same material as the outer foot 1230*a* (i.e., the same material as the plate portion 1230*d*) and otherwise substantially the same as the outer foot 1230*a*. In particular, the separately-formed ring-shaped outer foot 1230*a*' may be substantially the same as the outer foot 1230*a* in terms of width, shape, length, etc. The adhesive for connecting the separately-formed ring-shaped outer foot 1230*a*' to the plate portion may be similar to one of the adhesives described above such as adhesive 160, adhesive 365, etc.

FIG. 13A is a perspective view of a package assembly 1300 according to one or more embodiments. The package assembly 1300 may include a substrate 1310, and a package lid 1330 on the substrate 1310. The substrate 1310 may include, for example, a printed circuit board (PCB), system on integrated substrate (SoIS), or a package substrate such as the package substrate 110. The package assembly 1300 may include, for example, a COWOS device, a multi-chip module (MCM) device, or an integrated fan-out (InFO) large scale integrated (LSI) device. In particular, the package assembly 1300 may include a novel package lid design for chiplet integration. The novel design may reduce a coefficient of performance (COP) for the package assembly 1300 and improve an RA performance of the package assembly 1300.

FIG. 13B illustrates an arrangement of a plurality of semiconductor devices 1320 on the substrate 1310 for the package assembly 1300 according to one or more embodiments. The semiconductor devices 1320 may include, for example, a semiconductor chip, a chiplet, or an interposer module such as the interposer module 120. As illustrated in FIG. 13B, a dummy die 1390 may be placed on the substrate 1310 and used (e.g., in place of an inner foot) to connect the package lid 1330 to the substrate 1310. The dummy die 1390 may include, for example, a silicon dummy die. In one or more embodiments, the package assembly 1300 may include a multi-chip module (MCM) in which case the package substrate 110 may include a printed circuit board (PCB) and the plurality of interposer modules 120 may include semiconductor chips and/or chiplets.

FIG. 13C is a vertical cross-sectional view of the package assembly 1300 according to one or more embodiments. The package assembly 1300 may include the substrate 1310, the plurality of semiconductor devices 1320 mounted on the substrate 1310, and the dummy die 1390 mounted on the substrate 1310 between the semiconductor devices 1320. The package lid 1330 may be placed on the semiconductor devices 1320 and dummy die 1390 and attached to the substrate 1310. A TIM film such as the TIM film 140 may be formed on the semiconductor devices 1320.

The package lid 1330 may include a plate portion 1330*d* and an outer foot 1330*a* that may extend from the plate portion 1330*d*. The dummy die 1390 may be formed between the semiconductor devices 1320 and may be located in a central portion of the package lid 1330. A width of the dummy die 1390 may be greater than or equal to a width of the outer foot 1330*a*. In at least one embodiment, the width of the dummy die 1390 may be at least twice the width of the outer foot 1330*a*.

The dummy die 1390 may be attached to the plate portion 1330*d* by an adhesive 1366 that may be similar to the adhesive 160, 365, etc. The dummy die 1390 may have a length (e.g., from a bottom surface of the plate portion 1330*d*) that may be greater than or equal to a length of the outer foot 1330*a*. That is, the outer foot 1330*a* may extend from the plate portion 1330*d* by a first distance, and dummy die 1390 may extend from the plate portion 1330*d* by a second distance that is greater than or equal to the first distance. The outer foot 1330*a* may be formed on the package lid 1330, for example, by milling using a computer numerical control (CNC) milling machine, or by molding, punching or stamping the package lid 1330 to include the outer foot 1330*a*. The dummy die 1390 may be mounted on substrate 1310 before mounting the package lid 1330 on the substrate 1310. Alternatively, the dummy die 1390 may be attached to the package lid 1330 by the adhesive 1366, prior to mounting the package lid 1330 on the substrate 1310.

The outer foot 1330*a* may connect the package lid 1330 to the substrate 1310 by the first adhesive 1360, and the dummy die 1390 may connect the package lid 1330 to the substrate 1310 by a second adhesive 1365 (e.g., die attach film (DAF)). The first adhesive 1360 and the second adhesive 1365 may be similar to one of the adhesives described above such as adhesive 160, adhesive 365, etc. The first adhesive 1360 may be the same as the second adhesive 1365 or different (e.g., different physical properties) than the second adhesive 1365. For example, the first adhesive 1360 may be the same as or different from the second adhesive 1365 in terms of elastic modulus, tensile strength, coefficient of thermal expansion, etc. In particular, the first adhesive 1360 may have a first elastic modulus and the second adhesive 1365 may have a second elastic modulus that is less than the first elastic modulus. The first adhesive 1360 may have a thickness that is greater than or equal to a thickness of the second adhesive 1365. A width of the first adhesive 1360 may be substantially the same as a width of the outer foot 1330*a* and a width of the second adhesive 1365 may be substantially the same as a width of the dummy die 1390. Further, a horizontal cross-sectional shape of the first adhesive 1360 may be substantially the same as a horizontal cross-sectional shape of the outer foot 1330*a*, and a horizontal cross-sectional shape of the second adhesive 1365 may be substantially the same as horizontal cross-sectional shape of the dummy die 1390.

The package assembly 1300 including the first adhesive 1360 and second adhesive 1365 may provide the package assembly 1300 with several advantages. In particular, the second adhesive 1365 may act as stress buffer and reduce the risk of delamination of the TIM film from the semiconductor device 1320 from between the semiconductor device 1320 and package lid 1330, and reduce the risk of delamination of the first adhesive 1360 and second adhesive 1365 from the substrate 1310.

FIG. 13D is a vertical cross-sectional view of a package assembly 1300' according to one or more embodiments. The package assembly 1300' may be substantially the same as the package assembly 1300, except that that instead of package lid 1330 the package assembly 1300' may include a package lid 1330'.

The package lid 1330' may be a two-piece package lid with a first piece that may include a plate portion 1330d, and a second piece that may include a separately-formed ring-shaped outer foot 1330a' and an adhesive 1331 that may attach the ring-shaped outer foot 1330a' to the plate portion 1330d. In addition, as with the package assembly 1300, the dummy die 1390 may be located between the semiconductor devices 1320 and connect the plate portion 1330d to the substrate 1310. The separately-formed ring-shaped outer foot 1330a' may be made of the same material as the outer foot 1330a (i.e., the same material as the plate portion 1330d) and otherwise substantially the same as the outer foot 1330a. In particular, the separately-formed ring-shaped outer foot 1330a' may be substantially the same as the outer foot 1330a in terms of width, shape, length, etc. The adhesive 1331 may be similar to one of the adhesives described above such as adhesive 160, adhesive 365, etc.

FIGS. 14A-C illustrate alternative arrangements of the plurality of semiconductor devices 1320, dummy dies 1390 and I/O dies 1325 on the substrate 1310 for the package assembly 1300 or package assembly 1300' according to one or more embodiments. FIG. 14A illustrates an alternative arrangement that includes nine semiconductor devices 1320 and two dummy dies 1390 between the semiconductor devices 1320 according to one or more embodiments. FIG. 14B illustrates an alternative arrangement that includes four semiconductor devices 1320 and three dummy dies 1390 between the semiconductor devices 1320 according to one or more embodiments. FIG. 14C illustrates an alternative arrangement that includes thirty-six semiconductor devices 1320 and three dummy dies 1390 between the semiconductor devices 1320 according to one or more embodiments. FIG. 14D illustrates an alternative arrangement that includes semiconductor devices 1320 and two dummy dies 1390 between the semiconductor devices 1320 on the substrate 1310 for the package assembly 1300 according to one or more embodiments.

The novel package lid using the inner foot or dummy die may provide several advantages including, for example, 1) no requirement of new tool purchasing, 2) a reduction of package COP, 3) almost no cost added, and 4) better RA performance.

Referring now to FIGS. 15A-15D, in one or more embodiments, the TIM film 140 may include a gel TIM. The gel TIM may include, for example, a cross-linked polymer. In one or more embodiments, the cross-linked polymer may include a cross-linked siloxane polymer (e.g., a polymeric organic silicone having a backbone of alternating silicon-oxygen [Si—O] units with organic side chains attached to each silicon atom).

A series of experiments has revealed that a gel TIM may include void defects. Further, the series of experiments has revealed that cross-linking of the gel TIM may impact the formation of the void defects post MR (e.g., after multi-reflow processes). In particular, a gel TIM batch with a lower crossover time (e.g., less than 600 seconds) may result in more void defects post RA. The crossover time (e.g., cross-linking time) may be increased to reduce the void defects in the gel TIM (e.g., a screened batch of gel TIM), but the greater crossover time (e.g., greater than 611 seconds) may result in a higher CoM (e.g., higher cost of materials).

One or more embodiments of the present disclosure may provide a TIM film 140 including a gel TIM with a reduced number of void defects. The gel TIM may include a catalyst for polymer cross-linking (e.g., cross-linking catalyst). The catalyst may include, for example, platinum (Pt), but other catalysts are within the contemplated scope of this disclosure. By increasing the amount of catalyst, the void defects (e.g., the number of void defects, size of void defects, etc.) may be decreases in the TIM film 140 based on the same crossover time. That is, increasing the amount of platinum may enlarge a void free window for the gel TIM. An amount of catalyst (e.g., Pt) in the TIM film 140 may be precisely detected by using a liquid chromatographic detector such as an inductively coupled plasma mass spectrometer (ICP-MS). The embodiments of the present disclosure may help to alleviate the problems of a conventional gel TIM and its production methods (e.g., small process window for a current catalyst amount, high cost, long lead-time, etc.)

Figure 15A:
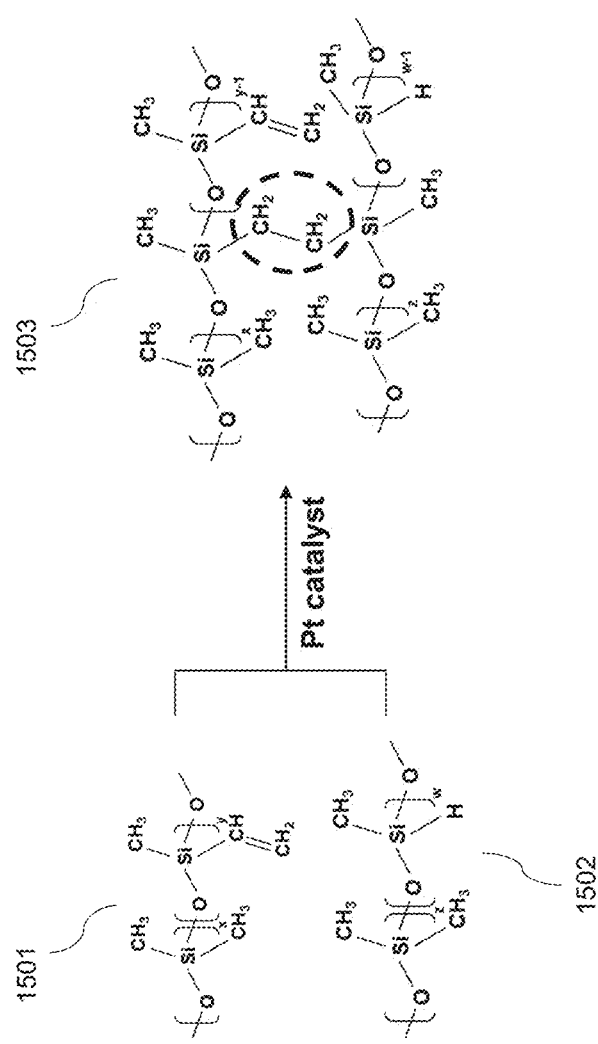
FIG. 15A illustrates an exemplary cross-linking mechanism (e.g., X23 cross-linking mechanism), according to one or more embodiments.

FIG. 15A illustrates an exemplary cross-linking mechanism (e.g., X23 cross-linking mechanism), according to one or more embodiments. The exemplary cross-linking mechanism may be realized, for example, in a gel TIM composition including organosilicon (e.g., silicone), silane, aluminum, zinc oxide and additive (including Pt catalyst). As illustrated in FIG. 15A, a first polysiloxane 1501 and second polysiloxane 1502 may be cross-linked in the presence of a Pt catalyst to form the cross-linked polysiloxane material 1503. In particular, the first polysiloxane 1501 and second polysiloxane 1502 may be cross-linked by a —$CH_2$—$CH_2$— bond. The cross-linked polysiloxane material 1503 may constitute a gel TIM (e.g., TIM film 140).

It should be noted that a low degree of cross-linking in the gel TIM may result in a significant number of void defects (e.g., many bubbles) in the gel TIM post MR. Experiments conducted by the inventors revealed that for a particular platinum ratio (Pt %), a crossover time of greater than 611 seconds resulted in a high degree of cross-linking and a gel TIM that passed (e.g., had a low number of void defects) post MR. However, a crossover time of only 584 seconds resulted in a low degree of cross-linking and a gel TIM that had a significant number of void defects (e.g., many bubbles) post MR.

FIG. 15B is a chart illustrating a detected platinum concentration (Pt conc.) in parts per million (ppm) in experimental gel TIM samples, according to one or more embodiments. The gel TIM samples were prepared from a composition that included the components (e.g., TIM Safety Data Sheet (SDS) components) of aluminum (about 70-80 weight %), zinc oxide (about 10-20 weight %), silicone (e.g., organosilicon) (about 10-20 weight %), silane (less than 1 weight %), and an additive including platinum (less than 0.1 weight %). The gel TIM samples were prepared having varying crossover times and platinum ratios (Pt ratios). A Pt ratio of 50% means that the amount of Pt in the gel TIM sample was 50% of the current production version, a Pt ratio of 100% means that the amount of Pt in the gel TIM sample was 100% of the current production version, and so on.

The platinum concentration was detected (e.g., by ICP-MS) for Sample A (crossover time of 648 s), Sample B (crossover time of 625 s), Sample D (crossover time of 612 s) and Sample F (crossover time of 543 s). Samples D and F showed a low number of void defects and were considered acceptable. Samples A and B showed a high number of void defects and were rejected. Thus, a gel TIM having an acceptable number of void defects (e.g., a gel TIM that is "void free") may be obtained by increasing the Pt ratio in the gel TIM with a low crossover time.

Based on the experimental results, it has been concluded that a crossover time may be less than 600 seconds (e.g., Sample F) if the Pt ratio (e.g., Pt amount) is greater than 100%. The crossover time may be disclosed, for example, in the certificate of analysis (CoA) items and a supplier's outgoing quality assurance (OQA) report. The inventors also concluded that Sample D (2.35 ppm) may represent an approximate lower limit on an acceptable Pt concentration in the gel TIM sample (e.g., TIM film 140), and Sample F (3.58 ppm) may represent an approximate upper limit on the acceptable Pt concentration in the gel TIM. In particular, the inventors concluded that in one or more embodiments, the Pt concentration in the gel TIM may be in range from 2 ppm to 4 ppm.

Referring to FIGS. 1A-15B, a package assembly 100, 200, 300, 400, 500, 800, 900, 1000, 1100, 1200, 1300 may include a package substrate 110, 810, 910, 1010, 1110, 1210, 1310, a package lid 130, 230, 430, 830, 930, 1030, 1130, 1230, 1330 attached to the package substrate 110, 810, 910, 1010, 1110, 1210, 1310 and including a plate portion 130*d*, 230*d*, 430*d*, 830*d*, 930*d*, 1030*d*, 1130*d*, 1230*d*, 1330*d*, an outer foot 130*a*, 230*a*, 430*a*, 830*a*, 930*a*, 1030*a*, 1130*a*, 1230*a*, 1330*a* extending from the plate portion 130*d*, 230*d*, 430*d*, 830*d*, 930*d*, 1030*d*, 1130*d*, 1230*d*, 1330*d*, and an inner foot 130*b*, 230*b*, 430*b*, 830*b*, 930*b*, 1030*b*, 1130*b*, 1230*b* extending from the plate portion 130*d*, 230*d*, 430*d*, 830*d*, 930*d*, 1030*d*, 1130*d*, 1230*d*, 1330*d*, inside the outer foot 130*a*, 230*a*, 430*a*, 830*a*, 930*a*, 1030*a*, 1130*a*, 1230*a*, 1330*a*, and an adhesive 160, 260, 360, 460 560, 860, 1360, that adheres the outer foot 130*a*, 230*a*, 430*a*, 830*a*, 930*a*, 1030*a*, 1130*a*, 1230*a*, 1330*a* to the package substrate 110, 810, 910, 1010, 1110, 1210, 1310 and the inner foot 130*b*, 230*b*, 430*b*, 830*b*, 930*b*, 1030*b*, 1130*b*, 1230*b* to the package substrate 110, 810, 910, 1010, 1110, 1210, 1310. The outer foot 130*a*, 230*a*, 430*a*, 830*a*, 930*a*, 1030*a*, 1130*a*, 1230*a*, 1330*a* may extend from the plate portion 130*d*, 230*d*, 430*d*, 830*d*, 930*d*, 1030*d*, 1130*d*, 1230*d*, 1330*d* by a first distance, and the inner foot 130*b*, 230*b*, 430*b*, 830*b*, 930*b*, 1030*b*, 1130*b*, 1230*b* may extend from the plate portion 130*d*, 230*d*, 430*d*, 830*d*, 930*d*, 1030*d*, 1130*d*, 1230*d*, 1330*d* by a second distance less than the first distance. The adhesive 160, 260, 360, 460 560, 860, 1360 may have a first thickness at the outer foot 130*a*, 230*a*, 430*a*, 830*a*, 930*a*, 1030*a*, 1130*a*, 1230*a*, 1330*a* and a second thickness at the inner foot 130*b*, 230*b*, 430*b*, 830*b*, 930*b*, 1030*b*, 1130*b*, 1230*b* and the second thickness may be greater than the first thickness. A difference between the first thickness and the second thickness may be in a range of 50 μm to 300 μm. The inner foot 130*b*, 230*b*, 430*b*, 830*b*, 930*b*, 1030*b*, 1130*b*, 1230*b* may include a first inner foot portion that extends from the plate portion 130*d*, 230*d*, 430*d*, 830*d*, 930*d*, 1030*d*, 1130*d*, 1230*d*, 1330*d* by the second distance, and a second inner foot portion that extends from the plate portion 130*d*, 230*d*, 430*d*, 830*d*, 930*d*, 1030*d*, 1130*d*, 1230*d*, 1330*d* by a third distance that is less than the second distance. The adhesive 160, 260, 360, 460 560, 860, 1360 may have a first thickness at the outer foot 130*a*, 230*a*, 430*a*, 830*a*, 930*a*, 1030*a*, 1130*a*, 1230*a*, 1330*a*, a second thickness at the first inner foot portion, and a third thickness at the second inner foot portion, and the second thickness is greater than the first thickness and the third thickness is greater than the second thickness. The adhesive 160, 260, 360, 460 560, 860, 1360 may include a first adhesive that adheres the outer foot 130*a*, 230*a*, 430*a*, 830*a*, 930*a*, 1030*a*, 1130*a*, 1230*a*, 1330*a* to the package substrate 110, 810, 910, 1010, 1110, 1210, 1310, and a second adhesive that is different than the first adhesive and adheres the inner foot 130*b*, 230*b*, 430*b*, 830*b*, 930*b*, 1030*b*, 1130*b*, 1230*b* to the package substrate 110, 810, 910, 1010, 1110, 1210, 1310. The first adhesive may have a first elastic modulus and the second adhesive may have a second elastic modulus that is less than the first elastic modulus. The inner foot 130*b*, 230*b*, 430*b*, 830*b*, 930*b*, 1030*b*, 1130*b*, 1230*b* may have a width that is greater than or equal to a width of the outer foot 130*a*, 230*a*, 430*a*, 830*a*, 930*a*, 1030*a*, 1130*a*, 1230*a*, 1330*a*. The inner foot 130*b*, 230*b*, 430*b*, 830*b*, 930*b*, 1030*b*, 1130*b*, 1230*b* may be joined to the outer foot 130*a*, 230*a*, 430*a*, 830*a*, 930*a*, 1030*a*, 1130*a*, 1230*a*, 1330*a* or separated from the outer foot 130*a*, 230*a*, 430*a*, 830*a*, 930*a*, 1030*a*, 1130*a*, 1230*a*, 1330*a*. The package assembly 100, 200, 300, 400, 500, 800, 900, 1000, 1100, 1200, 1300 may further include an interposer module 120 on the package substrate 110, 810, 910, 1010, 1110, 1210, 1310 and between the package lid 130, 230, 430, 830, 930, 1030, 1130, 1230, 1330 and the package substrate 110, 810, 910, 1010, 1110, 1210, 1310, and a thermal interface material (TIM) film between the interposer module 120 and the package lid 130, 230, 430, 830, 930, 1030, 1130, 1230, 1330, and the inner foot 130*b*, 230*b*, 430*b*, 830*b*, 930*b*, 1030*b*, 1130*b*, 1230*b* may be located between the outer foot 130*a*, 230*a*, 430*a*, 830*a*, 930*a*, 1030*a*, 1130*a*, 1230*a*, 1330*a* and the interposer module 120. The package assembly 100, 200, 300, 400, 500, 800, 900, 1000, 1100, 1200, 1300 may further include a plurality of semiconductor devices 820, 920, 1020, 1120, 1220, 1320 mounted on the package substrate 110, 810, 910, 1010, 1110, 1210, 1310 and between the package lid 130, 230, 430, 830, 930, 1030, 1130, 1230, 1330 and the package substrate 110, 810, 910, 1010, 1110, 1210, 1310, and a thermal interface material (TIM) film between the plurality of semiconductor devices 820, 920, 1020, 1120, 1220, 1320 and the package lid 130, 230, 430, 830, 930, 1030, 1130, 1230, 1330, and the inner foot 130*b*, 230*b*, 430*b*, 830*b*, 930*b*, 1030*b*, 1130*b*, 1230*b* may include an interior inner foot located between the plurality of semiconductor devices 820, 920, 1020, 1120, 1220, 1320 and may include one of a sight-shaped inner foot 930*b*, cross-shaped inner foot 1030*b*, 1230*b* and column-shaped inner foot 1130*b*. The outer foot 130*a*, 230*a*, 430*a*, 830*a*, 930*a*, 1030*a*, 1130*a*, 1230*a*, 1330*a* may extend from the plate portion 130*d*, 230*d*, 430*d*, 830*d*, 930*d*, 1030*d*, 1130*d*, 1230*d*, 1330*d* by a first distance, and the interior inner foot 130*b*, 230*b*, 430*b*, 830*b*, 930*b*, 1030*b*, 1130*b*, 1230*b* may extend from the plate portion 130*d*, 230*d*, 430*d*, 830*d*, 930*d*, 1030*d*, 1130*d*, 1230*d*, 1330*d* by a second distance equal to or greater than the first distance. The TIM film 140 may include a gel TIM including a cross-linking catalyst in a range from 2 ppm to 4 ppm.

Referring to FIGS. 1A-15B, a method of making a package assembly 100, 200, 300, 400, 500, 800, 900, 1000, 1100, 1200, 1300 may include forming an adhesive 160, 260, 360, 460 560, 860, 1360 on a package substrate 110, 810, 910, 1010, 1110, 1210, 1310, disposing a package lid 130, 230, 430, 830, 930, 1030, 1130, 1230, 1330 on the adhesive 160, 260, 360, 460 560, 860, 1360, the package lid 130, 230, 430, 830, 930, 1030, 1130, 1230, 1330 comprising a plate portion 130*d*, 230*d*, 430*d*, 830*d*, 930*d*, 1030*d*, 1130*d*, 1230*d*, 1330*d*, an outer foot 130*a*, 230*a*, 430*a*, 830*a*, 930*a*, 1030*a*, 1130*a*, 1230*a*, 1330*a* extending from the plate portion 130*d*, 230*d*, 430*d*, 830*d*, 930*d*, 1030*d*, 1130*d*, 1230*d*, 1330*d*, and an inner foot 130*b*, 230*b*, 430*b*, 830*b*, 930*b*, 1030*b*, 1130*b*, 1230*b* extending from the plate portion 130*d*, 230*d*, 430*d*, 830*d*, 930*d*, 1030*d*, 1130*d*, 1230*d*, 1330*d* inside the outer foot 130*a*, 230*a*, 430*a*, 830*a*, 930*a*, 1030*a*, 1130*a*, 1230*a*, 1330*a*, and pressing the package lid 130, 230, 430, 830, 930, 1030, 1130, 1230, 1330 onto the package substrate 110, 810, 910, 1010, 1110, 1210, 1310 and curing the adhesive 160, 260, 360, 460 560, 860, 1360 so that the adhesive 160, 260, 360, 460 560, 860, 1360 adheres the outer foot 130*a*, 230*a*, 430*a*, 830*a*, 930*a*, 1030*a*, 1130*a*, 1230*a*, 1330*a* to the package substrate 110, 810, 910, 1010, 1110, 1210, 1310 and the inner foot 130*b*, 230*b*, 430*b*, 830*b*, 930*b*, 1030*b*, 1130*b*, 1230*b* to the package substrate 110, 810, 910, 1010, 1110, 1210, 1310. The pressing of the package lid 130, 230, 430, 830, 930, 1030, 1130, 1230, 1330 onto the package substrate 110, 810, 910, 1010, 1110, 1210, 1310 may include pressing the outer foot 130*a*, 230*a*, 430*a*, 830*a*, 930*a*, 1030*a*, 1130*a*, 1230*a*, 1330*a* onto the adhesive 160, 260, 360, 460 560, 860, 1360 so that the adhesive 160, 260, 360, 460 560, 860, 1360 may have a first thickness at the outer foot 130*a*, 230*a*, 430*a*, 830*a*, 930*a*, 1030*a*, 1130*a*, 1230*a*, 1330*a*, and pressing the inner foot 130*b*, 230*b*, 430*b*, 830*b*, 930*b*, 1030*b*, 1130*b*, 1230*b* onto the adhesive 160, 260, 360, 460 560, 860, 1360 so that the adhesive 160, 260, 360, 460 560, 860, 1360 may have a second thickness at the inner foot 130*b*, 230*b*, 430*b*, 830*b*, 930*b*, 1030*b*, 1130*b*, 1230*b*, and the second thickness is greater than the first thickness. The method may further include mounting an interposer module 120 on the package substrate 110, 810, 910, 1010, 1110, 1210, 1310, and disposing a thermal interface material (TIM) film on the interposer module 120, and the disposing of the package lid 130, 230, 430, 830, 930, 1030, 1130, 1230, 1330 on the adhesive 160, 260, 360, 460 560, 860, 1360 may include locating the inner foot 130*b*, 230*b*, 430*b*, 830*b*, 930*b*, 1030*b*, 1130*b*, 1230*b* between the outer foot 130*a*, 230*a*, 430*a*, 830*a*, 930*a*, 1030*a*, 1130*a*, 1230*a*, 1330*a* and the interposer module 120. The method may further include mounting a plurality of semiconductor devices 820, 920, 1020, 1120, 1220, 1320 on the package substrate 110, 810, 910, 1010, 1110, 1210, 1310, and disposing a thermal interface material (TIM) film on the plurality of semiconductor devices 820, 920, 1020, 1120, 1220, 1320, and the disposing of the package lid 130, 230, 430, 830, 930, 1030, 1130, 1230, 1330 on the adhesive 160, 260, 360, 460 560, 860, 1360 may include locating the inner foot 130*b*, 230*b*, 430*b*, 830*b*, 930*b*, 1030*b*, 1130*b*, 1230*b* between the plurality of semiconductor devices 820, 920, 1020, 1120, 1220, 1320.

Referring to FIGS. 1A-15B, a package assembly 100, 200, 300, 400, 500, 800, 900, 1000, 1100, 1200, 1300 may include a package substrate 110, 810, 910, 1010, 1110, 1210, 1310, a package lid 130, 230, 430, 830, 930, 1030, 1130, 1230, 1330 mounted on the package substrate 110, 810, 910, 1010, 1110, 1210, 1310 and attached to the package substrate 110, 810, 910, 1010, 1110, 1210, 1310 by a first adhesive, a plurality of semiconductor devices 820, 920, 1020, 1120, 1220, 1320 mounted on the package substrate 110, 810, 910, 1010, 1110, 1210, 1310 between the package lid 130, 230, 430, 830, 930, 1030, 1130, 1230, 1330 and the package substrate 110, 810, 910, 1010, 1110, 1210, 1310, and a dummy die 1320 mounted on the package substrate 110, 810, 910, 1010, 1110, 1210, 1310 between the package lid 130, 230, 430, 830, 930, 1030, 1130, 1230, 1330 and the package substrate 110, 810, 910, 1010, 1110, 1210, 1310, the package lid 130, 230, 430, 830, 930, 1030, 1130, 1230, 1330 being attached to the dummy die 1320 by a second adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly comprising:
    a package substrate;
    a package lid attached to the package substrate, comprising:
        a plate portion;
        an outer foot extending from the plate portion; and
        an inner foot extending from the plate portion inside the outer foot; and
    an adhesive that adheres the outer foot to the package substrate and the inner foot to the package substrate, wherein the adhesive has a first thickness at the outer foot and a second thickness at the inner foot, and the second thickness is greater than the first thickness.

2. The package assembly of claim 1, wherein the outer foot extends from the plate portion by a first distance, and the inner foot extends from the plate portion by a second distance, wherein the second distance is less than the first distance.

3. The package assembly of claim 1, wherein a difference between the first thickness and the second thickness is in a range of 50 μm to 300 μm.

4. The package assembly of claim 2, wherein the inner foot comprises a first inner foot portion that extends from the plate portion by the second distance, and a second inner foot portion that extends from the plate portion by a third distance, wherein the third distance is less than the second distance.

5. The package assembly of claim 4, wherein the adhesive has a first thickness at the outer foot, a second thickness at the first inner foot portion, and a third thickness at the second inner foot portion, and
    wherein the second thickness is greater than the first thickness and the third thickness is greater than the second thickness.

6. The package assembly of claim 1, wherein the adhesive comprises:
    a first adhesive that adheres the outer foot to the package substrate; and
    a second adhesive that is different than the first adhesive and adheres the inner foot to the package substrate.

7. The package assembly of claim 6, wherein the first adhesive has a first elastic modulus and the second adhesive has a second elastic modulus, wherein the second elastic modulus is less than the first elastic modulus.

8. The package assembly of claim 1, wherein the inner foot has a width that is greater than or equal to a width of the outer foot.

9. The package assembly of claim 1, wherein the inner foot is one of joined to the outer foot or separated from the outer foot.

10. The package assembly of claim 1, further comprising:
    an interposer module on the package substrate and between the package lid and the package substrate; and
    a thermal interface material (TIM) film between the interposer module and the package lid.

11. The package assembly of claim 10, wherein the inner foot is located between the outer foot and the interposer module.

12. The package assembly of claim 1, further comprising:
a plurality of semiconductor devices mounted on the package substrate and between the package lid and the package substrate; and
a thermal interface material (TIM) film between the plurality of semiconductor devices and the package lid.

13. The package assembly of claim 12, wherein the inner foot comprises an interior inner foot located between the plurality of semiconductor devices and comprises one of a sight-shaped inner foot, cross-shaped inner foot and column-shaped inner foot, and
wherein the outer foot extends from the plate portion by a first distance, and the interior inner foot extends from the plate portion by a second distance equal to or greater than the first distance.

14. The package assembly of claim 12, wherein the TIM film comprises a gel TIM including a cross-linking catalyst in a range from 2 ppm to 4 ppm.

15. A method of making a package assembly, the method comprising:
forming an adhesive on a package substrate;
disposing a package lid on the adhesive, the package lid comprising a plate portion, an outer foot extending from the plate portion, and an inner foot extending from the plate portion inside the outer foot; and
pressing the package lid onto the package substrate and curing the adhesive so that the adhesive adheres the outer foot to the package substrate and the inner foot to the package substrate, wherein the pressing of the package lid onto the package substrate comprises:
pressing the outer foot onto the adhesive so that the adhesive has a first thickness at the outer foot; and
pressing the inner foot onto the adhesive so that the adhesive has a second thickness at the inner foot, and the second thickness is greater than the first thickness.

16. The method of claim 15, further comprising:
mounting an interposer module on the package substrate; and
disposing a thermal interface material (TIM) film on the interposer module,
wherein the disposing of the package lid on the adhesive comprises locating the inner foot between the outer foot and the interposer module.

17. The method of claim 15, further comprising:
mounting a plurality of semiconductor devices on the package substrate; and
disposing a thermal interface material (TIM) film on the plurality of semiconductor devices,
wherein the disposing of the package lid on the adhesive comprises locating the inner foot between the plurality of semiconductor devices.

18. A package assembly comprising:
a package substrate;
a package lid mounted on the package substrate and attached to the package substrate by a first adhesive;
a plurality of semiconductor devices mounted on the package substrate between the package lid and the package substrate; and
a dummy die mounted on the package substrate between the package lid and the package substrate, wherein the dummy die is attached to the package substrate between the plurality of semiconductor devices and the package lid is attached to the dummy die by a second adhesive.

19. The package assembly of claim 18, wherein the package lid is attached to an upper surface of the package substrate by the first adhesive and the dummy die is attached to the upper surface of the package substrate by an adhesive.

20. The package assembly of claim 18, wherein the package lid comprises an outer foot attached to the package substrate and a semiconductor device of the plurality of semiconductor devices is located between the dummy die and the outer foot of the package lid.

* * * * *